(12) United States Patent
Durkin et al.

(10) Patent No.: US 7,936,796 B2
(45) Date of Patent: May 3, 2011

(54) APPARATUS FOR PROVIDING OPTICAL RADIATION

(75) Inventors: Michael Kevan Durkin, Southampton (GB); Stephen Roy Norman, Romsey (GB); Fabio Ghiringhelli, Southampton (GB); David Neil Payne, Southampton (GB); Louise Mary Brendan Hickey, Windsor (GB); Jayanta Kumar Sahu, Southampton (GB); Mikhail Nickolaos Zervas, Southampton (GB); Andy Piper, Southampton (GB); Andrew Michael Gillooly, Southampton (GB)

(73) Assignee: SPI Lasers UK Ltd, Southampton (GB)

( * ) Notice: Subject to any disclaimer, the term of this patent is extended or adjusted under 35 U.S.C. 154(b) by 629 days.

(21) Appl. No.: 11/803,036

(22) Filed: May 11, 2007

(65) Prior Publication Data

US 2009/0016387 A1  Jan. 15, 2009

Related U.S. Application Data

(60) Provisional application No. 60/799,456, filed on May 11, 2006, provisional application No. 60/812,164, filed on Jun. 9, 2006, provisional application No. 60/819,439, filed on Jul. 7, 2006, provisional application No. 60/834,974, filed on Jul. 31, 2006.

(51) Int. Cl.
*H01S 3/30* (2006.01)

(52) U.S. Cl. .................... 372/6; 372/25; 372/70

(58) Field of Classification Search .............. 372/6
See application file for complete search history.

(56) References Cited

U.S. PATENT DOCUMENTS

| | | | | |
|---|---|---|---|---|
| 5,278,850 A * | 1/1994 | Ainslie et al. | ............ | 372/6 |
| 5,530,709 A * | 6/1996 | Waarts et al. | ............ | 372/6 |
| 6,151,338 A | 11/2000 | Grubb et al. | | |
| 6,584,246 B1 * | 6/2003 | Michal et al. | .......... | 385/27 |
| 6,636,347 B1 | 10/2003 | Wang et al. | | |
| 2006/0050367 A1 * | 3/2006 | Yamada et al. | ........ | 359/341.1 |

FOREIGN PATENT DOCUMENTS

| | | |
|---|---|---|
| EP | 0 533 324 A2 | 3/1993 |
| EP | 0 533 324 A3 | 3/1993 |
| EP | 1 107 404 A1 | 6/2001 |

OTHER PUBLICATIONS

Achtenhagen et al., "L-I Characteristics of Fiber Bragg Grating Stabilized 980-nm Pump Lasers", IEEE Photonics Tech'y Letters, vol. 13 No. 5 May 2001, pp. 415-417.

(Continued)

*Primary Examiner* — Minsun Harvey
*Assistant Examiner* — Xnning Niu
(74) *Attorney, Agent, or Firm* — John S. Reid

(57) ABSTRACT

In one embodiment, a photo-darkening resistant optical fiber includes a waveguide having a numerical aperture less than 0.15. The waveguide includes a core having a refractive index n1 and a pedestal having a refractive index n2, and wherein the fiber includes a first cladding having a refractive index n3 surrounding the pedestal, wherein n1 is greater than n2, n2 is greater than n3. The core includes silica, a concentration of alumina of between approximately 0.3 to 0.8 mole percent, a concentration of phosphate of substantially 15 mole percent, a concentration of ytterbium substantially in the range 20000 to 45000 ppm. The pedestal can include silica, phosphate and germania. The core can have substantially zero thulium dopant.

32 Claims, 17 Drawing Sheets

OTHER PUBLICATIONS

A. Piper et al., "A compact 1 GHz, 16ps pulse source operating at 1060nm incorporating a high power gain-switched semiconductor laser and fiber grating pulse compressor", Lasers and Electro-Optics Europe, 2005 Conference, Munich, Germany Jun. 12-17, 2005, p. 358, IEEE.

Kakui M. et al: "S-band optical amplification employing silica-based phosphorous/a,umina-codpoed EDF"; Optical Fiber Communication Conf., 2004, Feb. 26, 2004, pp. 384-386, vol. 2, Optical Soc. of America, USA.

Vervas M. N. et al: "High peak power, high rep-rate pulsed fibre laser for marking applications", Proceedings of the SPIE, Jan. 1, 2006, pp. 61020Q1-6102Q11, vol. 6102, SPIE, Bellingham, VA, USA.

Koponen J. J. et al: "Photodarkening in ytterbium-doped silica fibers"; Proc. of the SPIE, Jan. 1, 2005, pp. 1-10, vol. 5990, SPIE, Bellingham, VA, USA.

\* cited by examiner

APPARATUS FOR PROVIDING OPTICAL RADIATION

CROSS REFERENCE TO RELATED APPLICATIONS

This application claims priority under 35 USC §120 to U.S. Provisional patent application Ser. Nos. 60/799,456 (filed May 11, 2006), 60/812,164 (filed Jun. 9, 2006), 60/819,439 (filed Jul. 7, 2006), and 60/834,974 (filed Jul. 31, 2006), all of which are hereby incorporated herein in their entirety.

FIELD

This application relates to apparatus for providing optical radiation. The apparatus can form the basis of an apparatus for material processing.

BACKGROUND

Fibre pulsed lasers are increasingly being adopted as the laser of choice in a number of industrial applications, such as micromachining, drilling and marking. In peak-power-driven applications, such as marking, it is essential to retain high peak powers (in excess of 2.5 to 5 kW) at high repetition rates in order to achieve faster character marking and increased throughput.

Conventional single-stage Q-switched lasers are very efficient in storing energy. However, they are characterised by variable average power and substantial peak-power drop as the repetition rate is increased. In most cases, the peak power can drop below the process (e.g. marking) threshold with an adverse effect on speed and throughput. Master oscillator power amplifier (MOPA) configurations, on the other hand, can offer more controllability over the pulse characteristics and power performance of the pulsed laser and extend the operation space of a marking unit to higher repetition rates offering increased marking speed. There is a requirement for pulsed lasers which maintain the peak power over a 5 kW level for repetition rates in excess of 200 kHz. The average power should be in excess of 10 W, the pulse energy lies in the 0.1-0.5 mJ range or higher, the pulse duration to be variable between 10 ns and 200 ns, while the peak power should remain substantially constant at about the 5 kW or 10 kW level for rep rates in the range 10 kHz to >200 kHz. Additional requirements are good beam quality such as can be provided by a low-moded or single-moded fibre laser.

At these intensity and peak-power levels, special care is needed in the pulsed system to avoid the onset of optical non-linearities and optical damage. In addition, under the resulting high-gain, high inversion operating conditions the active fibre is not subject to photodarkening effects as that will reduce the efficiency and lifetime of the pulsed system.

A number of different pulsed fibre laser configurations have been proposed and used in a stand-alone fashion or as part of a master-oscillator power amplifier (MOPA) configuration. Q-switched fibre lasers, in particular, are quite attractive because they can produce high peak powers and several mJ pulse energies in a relatively simple and stable configuration. One of the main drawbacks of stand-alone Q-switched lasers, which are intended to be used in an industrial application in a versatile manner in order to increase the application space, is that all the parameters of interest, such as the pulse repetition rate (PRR), energy, peak power and pulse width, are interrelated and cannot be controlled independently. In particular, the peak power reduces as the pulse repetition frequency increases.

A number of these performance issues can be resolved and the required high peak power performance can be extended in the high PRR regime by using a multiple-amplification-stage MOPA configuration.

In this case the pulsed seed can be either a low power Q-switched laser or a directly modulated semiconductor laser. The latter can be controlled directly and provides much more freedom in defining the pulse shape and pulse repetition frequency, as well as, it gives the possibility of changing them at will to better fulfil the application needs. In addition, it is based on the well-developed and extremely reliable semiconductor technology developed over the years for the telecommunications industry. Different parameters of the amplified pulse sequences are defined accurately by controlling the gain distribution along the amplification chain.

The local inversion in a fibre amplifier increases considerably before the arrival of a pulse towards the output end of the amplifier. Knowledge of the inversion distribution is very important in defining the photodarkening rate in case where a fibre prone to this performance-degrading effect is used. As the pulse propagates, it depletes the inversion and increases its intensity. The amplification process also results in significant pulse reshaping and front-end sharpening. This is extremely important in defining pulse width and peak-power and as a consequence defines the onset of various non-linearities such as stimulated Raman scattering (SRS) and stimulated Brillouin scattering (SBS). Above a certain energy level, all pulses reshape (sharpen) considerably and reduce their pulse width. This is due to the fact that the pulse acquires enough energy to start saturating the amplifier. It is known that under such conditions, energy is extracted primarily by the leading edge of the pulse resulting in pulse reshaping and distortion. Peak power increases nonlinearly with pulse energy and inevitably exceeds the SRS threshold, which is typically around 5 kW to 10 kW, depending upon the fibre design and pulse shape.

Another important effect that limits the output power of pulsed fibre lasers is the formation of giant pulses. These can catastrophically damage the optical components in the system. The effect is believed to be highly dependent upon the peak power and the spectral properties of the laser and believed to arise from stimulated Brillouin scattering (SBS). When the non-linear threshold is reached, forward going pulses are reflected. Giant pulses are observed, and these can catastrophically damage the amplifiers (and other devices) in pulse laser systems. Unfortunately, the effect is stochastic in nature, and by itself very unpredictable. A single variation in the instantaneous spectral properties of a seed laser (such as a laser diode) which narrows the linewidth can result in an SBS event, and trigger giant pulse formation and subsequent catastrophic damage. Such damage has been observed in lasers months after they have been installed in industrial processing equipment.

Fibre lasers are often pumped by laser diodes. These laser diodes can be damaged by undesired optical radiation propagating from the laser to the diodes. The effect is particularly severe in pulsed lasers because laser diodes are damaged by peak power rather than the energy of a pulse. Pulsed lasers have much higher peak powers than continuous wave lasers. Therefore the requirement to isolate the pumps from the laser is more stringent in a pulsed laser than a continuous wave laser.

A very important issue related to the long-term behavior of Yb3+ doped fiber lasers and amplifiers is the effect of photodarkening. The effect shows as a gradual increase of the fibre background loss with time, which reduces the output power and overall efficiency of the optical system. It is believed to be related to the optical activation of pre-existing fibre color centres, with absorption bands mainly in the UV spectral region. However, the tails of the absorption bands extend into the near-IR adversely affecting the optical performance. Photodarkening results in gradual degradation and is not known to result in catastrophic sudden fibre failures. Photodarkening rate and final level is shown to be dependent on the active fibre degree of inversion and, as a result, different amplified systems will show different degradation.

Many applications of optical fibres require the generation and transmission of optical signals having intensities at which the transparency of the optical fibre degrades with time. The effect is known as photo-darkening, which is a light-induced change in the absorption of glass. The increase in absorption is believed to be due to the formation or activation of color centers that strongly absorb light in the UV and visible part of the spectrum.

In the spectral domain, photodarkening shows as a sharp loss increase below a wavelength of approximately 800 nm. The tail of this strong absorption band extends well into the 1 micron to 1.5 micron region and affects adversely the losses at both the pump and signal wavelengths. This has a severe limiting effect on the performance and overall efficiency of fiber lasers and amplifiers operating in this wavelength regime.

In the time domain, photodarkening shows as a gradual pseudo-exponential decrease of the laser or amplifier output power to an asymptotic value. The final power drop and related time scale seems to depend on the fiber laser or amplifier operating conditions, most notably the pump and average inversion levels, as well as, the operating temperature. The output power drop could be compensated by the provision of additional pump sources and/or the increase of driving pump current. Both measures are highly undesirable since the former results in increased unit cost while the latter results in accelerated of the pump-unit ageing and increased catastrophic failure probability.

Optical fibre lasers and amplifiers often include rare-earth dopant which can lead to photo-darkening via multi-photon processes. The effect is seen in at least $Tm^{3+}$, $Yb^{3+}$, $Ce^{3+}$, $Pr^{3+}$, and $Eu^{3+}$ doped silica glasses.

Photodarkening is problematic when optical fibres are used in the industrial material processing. The effect can degrade the transmission in fibres used to deliver laser radiation from lasers (such as frequency-doubled, -tripled rod lasers, disk lasers, and fibre lasers) to a work piece, It can also severely limit the amount of optical power that can be generated in a fibre laser or amplified by an optical amplifier.

Conventional methods to reduce photo-darkening in glass are to use silica with high hydroxyl (OH) content, so-called "wet silica". This can be loaded with deuterium and irradiated with ultra-violet (UV) light. However these approaches are not well suited for fibre lasers because the OH will increase the background loss of the optical fibre.

There is a need for a pulsed laser that maintains its peak power over a wide range of repetition frequencies and in which non-linear effects are controlled.

There is a need for fibre lasers that are resistant to pump damage.

There is a need for fibre lasers that are resistant to catastrophic damage from giant pulse formation.

There is a need for a photo-darkening resistant optical fibre. There is a related need for a fibre laser and amplifier that is resistant to photo-darkening. By photo-darkening, it is meant any light-induced decrease in transmission of glass, whether temporary or permanent.

SUMMARY

According to a non-limiting embodiment an apparatus for providing optical radiation includes a seed laser, at least one amplifier, and a reflector, wherein the seed laser is a Fabry Perot semiconductor laser. The seed laser is connected to the amplifier via the reflector, and the reflector is arranged to reflect a proportion of the seeding radiation emitted by the seed laser back into the seed laser. The amplifier includes an optical fibre which includes a core having a refractive index n1 and a pedestal having a refractive index n2, and the optical fibre includes a first cladding made of glass having a refractive index n3 surrounding the pedestal. Further, n1 is greater than n2, and n2 is greater than n3.

We have found that use of such a reflector has been found to effectively eliminate the occurrence of giant pulses, believed to arise as a result of stimulated Brillouin scattering.

Incorporation of the pedestal is advantageous because it can reduce the cross-coupling of signal power to the first cladding. This has been found to dramatically reduce pump diode failure in cladding pumped fibre lasers and amplifiers.

The reflector can be a dispersive reflector.

The seed laser can be characterized by an effective optical transit time. The reflector can be characterized by a bandwidth and a round-trip reflective time-delay variation over the bandwidth. The round-trip reflective time-delay variation can be greater than the effective optical transit time.

The proportion of the seeding radiation emitted by the seed laser reflected back into the seed laser can be less than 20%. The proportion can be between 1% and 10%.

The reflector can be located a distance less than 5 m from the seed laser. The distance can be less than 2 m. The distance can be between 0.5 m and 1.5 m.

The reflector can be located a distance between 5 mm and 50 cm from the seed laser.

A peak power emitted from the apparatus can exceed 1 kW.

The core can include silica, a concentration of alumina in the range 0.1 to 4 mole percent, a concentration of phosphate in the range 2 to 20 mole percent. The pedestal can comprise silica, phosphate and germania. The optical fibre is preferably (but not necessarily) a photo-darkening resistant optical fibre. The waveguide preferably (but not necessarily) has a numerical aperture less than 0.15.

An advantage of the apparatus is that the optical fibre is capable of transmitting optical radiation at high intensities. The low numerical aperture means that the fibre can be configured to be a so-called large mode area fibre, which in combination with the high intensities, permits the output power and/or product lifetime of fibre lasers and amplifiers to be increased. A further advantage in the design of fibre lasers and amplifiers provided for herein is that fewer pump diodes are required since the optical fibre maintains its transmission quality over the product lifetime.

The core can include silica, a concentration of alumina in the range 0.1 to 4 mole percent and a concentration of phosphate in the range 2 to 20 mole percent. The alumina doped core in combination with the germano-phosphorus doped pedestal permits low numerical aperture fibres to be manufacturable with improved repeatability as compared with the prior art. Numerical apertures as low as 0.06 to 0.1, or preferably approximately 0.08 are readily achievable.

The pedestal can include silica, phosphate and germania. The concentration of phosphate and germania are selected to achieve the desired numerical aperture. Incorporation of germania has the advantage of increasing the fictive temperature of the pedestal and thus assisting in the retention of both circularity and core to pedestal concentricity and hence core to first cladding concentricity during the optical fibre manufacturing process. Core concentricity is important in the production of low-loss fusion splices.

Preferably (but not necessarily) there is substantially zero thulium dopant in the core. Preferably (but not necessarily) other trace rare-earth dopants should also be avoided. The importance of eliminating thulium dopant is important in the design of fibre lasers and amplifiers as fibres containing thulium dopant have been found to be especially susceptible to photo-darkening. It is important therefore to use rare-earth dopants that have low trace amounts of thulium. The thulium concentration should be less than approximately 10 ppm, and preferably less than 1 ppm.

The optical fibre can be doped with at least one rare earth dopant disposed in at least one of the core and the pedestal. The rare earth dopant can be ytterbium having a concentration in the range 2000 to 60000 ppm. The concentration of ytterbium can be between approximately 15000 to 50000 ppm. The concentration of ytterbium is preferably between approximately 20000 to 45000 ppm.

The concentration of phosphate in the core can be between approximately 12 to 17 mole percent. The concentration of phosphate in the core is preferably approximately 15 mole percent.

The concentration of alumina can be between approximately 0.20 to 1 mole percent. The concentration of alumina is preferably between approximately 0.3 and 0.8 mole percent.

The waveguide can be a multimode waveguide at a signal wavelength. The waveguide can be configured to propagate single mode light without significant distortion over a substantial length.

The waveguide can be a single mode waveguide.

The optical fibre can include at least one stress producing region for inducing birefringence in the core.

The photo-darkening resistant optical fibre can include a waveguide having a numerical aperture less than 0.15, wherein the waveguide includes a core having a refractive index n1 and a pedestal having a refractive index n2, and wherein the fibre includes a first cladding having a refractive index n3 surrounding the pedestal, wherein n1 is greater than n2, n2 is greater than n3. The core includes silica, a concentration of alumina of between approximately 0.3 to 0.8 mole percent, a concentration of phosphate of substantially 15 mole percent, a concentration of ytterbium substantially in the range 20000 to 45000 ppm. The pedestal can include silica, phosphate and germania. Preferably (but not necessarily) the core includes substantially zero thulium dopant.

The waveguide can be a multimode waveguide at a signal wavelength, and the waveguide can be configured to propagate single mode light without significant distortion over a substantial length. Alternatively, the waveguide can be a singlemode waveguide.

The optical fibre can be used in an apparatus in the form of a cladding pumped amplifying optical device comprising at least one source of pump energy. This is particularly advantageous because signal light scattering or leaking from the low numerical aperture core is preferentially captured and guided by the pedestal, and therefore is not routed back into the pumps. The apparatus therefore removes one of the major failure mechanisms of cladding pumped lasers, namely the catastrophic failure of pump diodes caused by unwanted signal light.

The optical fibre can be used in an apparatus in the form of an amplifier, a laser, a master-oscillator power amplifier, a Q-switched laser or an ultra-fast laser comprising at least one source of pump energy.

A further embodiment described and provided for herein is for an apparatus in the form of a laser for material processing, including at least one source of pump energy, an optical fibre, a laser delivery fibre, and a processing head.

Yet another embodiment described and provided for herein is a method of marking which method includes the step of providing a reflector within a marking laser.

An additional embodiment described and provided for herein is a material when processed using apparatus according to the present disclosure. The material can be a semiconductor package (plastic or ceramic), a key pad on a mobile phone, an iPOD, a computer, a component, a package, or a commercial or industrial product.

A further apparatus provided for herein can be in the form of a laser for material processing, including at least one source of pump energy, an optical fibre, a laser delivery fibre, and a processing head.

Another embodiment provided for herein is to replace the seed laser and the reflector with a surface emitting light emitting diode (SLED). An SLED can be amplified such that its use also dramatically reduces the onset of SBS.

BRIEF DESCRIPTION OF THE DRAWINGS

Embodiments of the present disclosure will now be described solely by way of example and with reference to the accompanying drawings in which.

DETAILED DESCRIPTION

Figure 38:
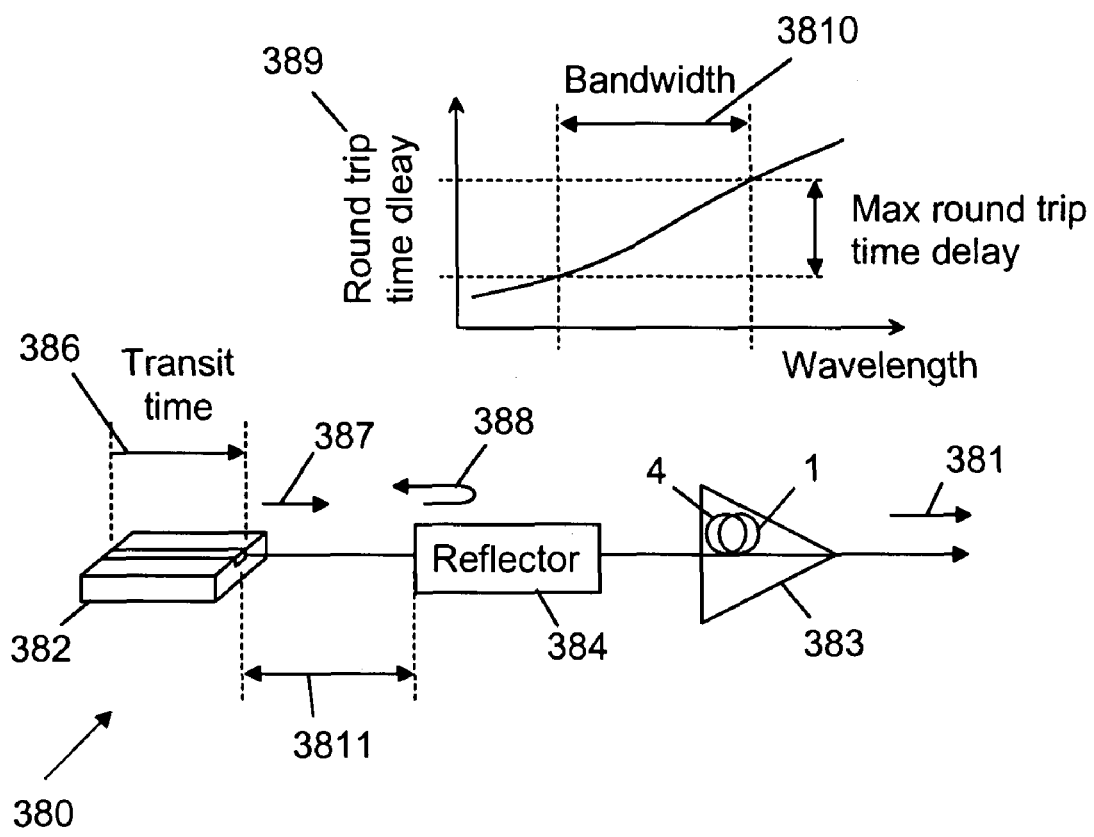
FIG. 38 shows apparatus comprising a reflector and a pedestal.

With reference to FIG. 38, there is provided an apparatus 380 for providing optical radiation 381 including a seed laser 382, at least one amplifier 383, and a reflector 384, wherein the seed laser 382 is a Fabry Perot semiconductor laser, the seed laser 382 is connected to the amplifier 383 via the reflector 384, the amplifier 383 includes an optical fibre 1 (per FIG. 1) which includes a pedestal 4 made from glass, and the reflector 384 is arranged to reflect a proportion 388 of the seeding radiation 387 emitted by the seed laser 382 back into the seed laser 382.

The pedestal 4 protects the apparatus 380 from being damaged by optical radiation 381 leaking from the optical fibre 1.

The reflector 384 protects the apparatus 380 from damage. The reflector 384 is believed to prevent the seed laser 382 from emitting the seeding radiation 387 in a single longitudinal mode (or a few longitudinal modes), thus suppressing the onset of stimulated Brillouin scattering.

Preferably (but not necessarily) the reflector 384 is a dispersive reflector.

Preferably the seed laser 382 is characterized by an effective optical transit time 386, the reflector 384 is characterized by a bandwidth 3810 and a round-trip reflective time-delay variation 389 over the bandwidth 3810, and the round-trip reflective time-delay variation 389 is greater than the effective optical transit time 386.

The proportion 388 may be less than 20%. The proportion is preferably 1% to 10%.

The reflector 384 is located a distance 3811 from the seed laser 382. A 1 m distance corresponds to approximately 10 ns round trip delay in an optical fibre. The build up time for stimulated Brillouin scattering in optical fibres is approximately 20 ns to 40 ns depending upon the material composition. It is important that the reflector 384 is positioned such that the feedback has time to influence the emission from the seed laser 382. The distance 3811 should be less than 5 m. The distance 3811 should ideally be less than 2 m. The distance is preferably between 0.5 m and 1.5 m. Alternatively, the reflector 384 may be packaged with the seed laser 382, and the distance 3811 may be between 5 mm and 50 cm.

The invention has most utility for apparatus 380 configured as a pulsed fibre lasers which may have a peak powers greater than 1 kW within the first 200 ns of switch on. The above distances 3811 may be selected to ensure that the feedback from the reflector 384 occurs while the apparatus 380 is emitting power above 1 kW.

By effective optical transit time 386, it is meant the time taken for light to propagate in a forwards direction through the seed laser 382.

Figure 1:
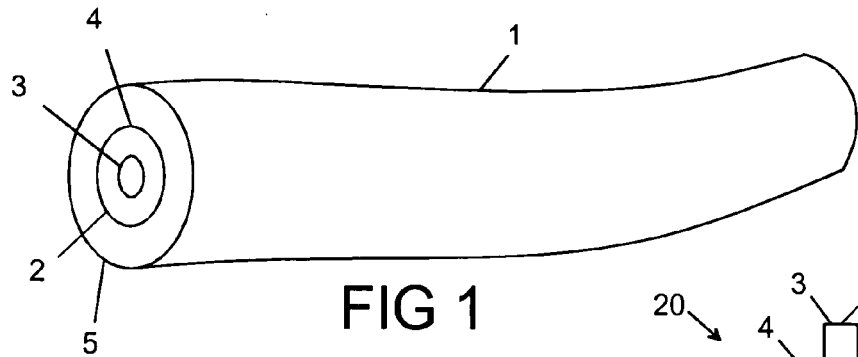
FIG. 1 shows apparatus according to the present invention.

The optical fibre 1 includes a waveguide 2 such as shown in FIG. 1. The waveguide 2 includes a core 3 having a refractive index n1 and a pedestal 4 having a refractive index n2, and a first cladding 5 made of glass and having a refractive index n3. Preferably n1>n2>n3. The optical fibre 1 is preferably coated with a coating (not shown) that has a refractive index less than n3. The fibre 1 can then be cladding pumped by coupling pump radiation into at least the first cladding 5. The coating is preferably a polymer. It has been found that cladding pumped fibre lasers are less resistant to optical radiation damaging the pump diodes when pedestal fibres such as shown in FIG. 1 are used within the amplifiers. Preferably (but not necessarily) the optical fibre 1 is side pumped.

The optical fibre 1 is preferably (but not necessarily) a photo-darkening resistant optical fibre. By "resistant", we mean that the increase in attenuation of the optical fibre 1 during operation should be no greater than 10%. Preferably the increase in attenuation should be no greater than 5% in 2,000 hours. Preferably, the increase should be less than 1% in 2,000 hours. Measurement data on photo-darkening is described in detail below.

The optical fibre 1 preferably has a numerical aperture less than 0.15.

In the following and in the claims, there is frequent reference to materials such as silica, phosphate, alumina, and germania. By silica, it is meant pure silica, doped silica, and heavily doped silica glasses, which glasses are sometimes referred to as silicate or silicic glasses. By phosphate, it is meant oxides of phosphorus such as phosphorus pentoxide ($P_2O_5$). By alumina, it is meant oxides of aluminum (referred to as "aluminium" in Europe) such as $Al_2O_3$. By germania, it is meant the oxides of germania, and in particular (but not exclusively) $GeO_2$. By ytterbium, it is meant ytterbium incorporated into the glass as an oxide, and the concentration in ppm is the concentration of the ions of ytterbium, and in particular $Yb^{3+}$. Similarly, by reference to other rare-earth metals (such as thulium, erbium etc), it is meant the rare-earth metal incorporated into the glass as an oxide, and the concentration in ppm is the concentration of the ions of rare-earth metal.

Figure 2:
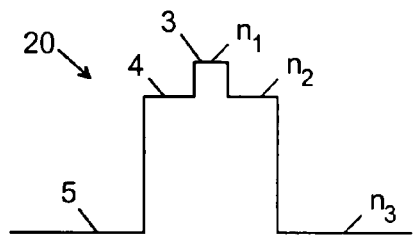
FIG. 2 shows a refractive index profile of an optical fibre.

FIG. 2 shows a refractive index profile 20 of the fibre 1. The refractive indices of the core 3, pedestal 4, and first cladding 5 are n1, n2 and n3 respectively. It is preferred that n1 is greater than n2 and n2 is greater than n3.

One desirable embodiment has a core 3 that comprises silica glass with a concentration of alumina of between approximately 0.3 to 0.8 mole percent, and a concentration of phosphate of substantially 15 mole percent. It is preferred (but not required) that there is substantially zero thulium dopant. It is preferred (but not required) that the pedestal 4 includes silica, phosphate and germania. The first cladding 5 can be pure silica, fluorine doped silica, or other cladding materials (including polymers) used in the manufacture of optical fibres. In the event that the first cladding 5 is a glass, the fibre 1 is preferably (but not necessarily) coated with a polymer which can have an index lower than the refractive index of the first cladding 5 in order to guide pump light in amplifiers and lasers. For application as the gain medium in fibre lasers and amplifiers, at least one of the core 3 and pedestal 4 is doped with rare-earth dopant. The rare earth dopant can be ytterbium whose concentration is preferably substantially in the range 20000 to 45000 ppm.

An advantage of using a photo-darkening resistant fibre is that the optical fibre 1 is capable of transmitting optical radiation under high pumping and inversion conditions as well as high intensities. The low numerical aperture means that the fibre 1 can be configured to be a so-called large mode area fibre, which in combination with the high pumping and inversion conditions, permits the output power and/or product lifetime of fibre lasers and amplifiers to be increased. The design of large mode area fibres is described in U.S. Pat. No. 6,614,975, which is hereby incorporated herein by reference. A further advantage in the design of fibre lasers and amplifiers is that fewer pump diodes are required since the optical fibre maintains its transmission quality over the product lifetime.

Although the above figures represent a preferred embodiment, the core 3 can comprise silica, with a concentration of alumina in the range 0.1 to 4 mole percent and a concentration of phosphate in the range 2 to 20 mole percent. The alumina doped core in combination with the germano-phosphorus doped pedestal permits low numerical aperture fibres to be manufacturable with improved repeatability as compared with the prior art. Numerical apertures as low as 0.06 to 0.1, or preferably approximately 0.08 are readily achievable.

The pedestal 4 can include silica, phosphate and germania. The concentration of phosphate and germania are selected to achieve the desired numerical aperture. Incorporation of germania has the advantage of increasing the fictive temperature of the pedestal 4 and thus assisting in the retention of both circularity and core 3 to pedestal 4 concentricity, and hence core 3 to first cladding 5 concentricity, during the optical fibre manufacturing process. Core concentricity is relevant in the production of low-loss fusion splices.

Preferably (but not necessarily) there is substantially zero thulium dopant in the core 3. The importance of eliminating thulium dopant is significant in the design of fibre lasers and amplifiers as fibres containing thulium dopant have been found to be especially susceptible to photo-darkening. It is important therefore to use rare-earth dopants that have low trace amounts of thulium. The thulium concentration should be less than approximately 10 ppm, and preferably less than 1 ppm.

The optical fibre 1 can be doped with at least one rare earth dopant disposed in at least one of the core 3 and the pedestal 4. The rare earth dopant can be ytterbium having a concentration in the range 2000 to 60000 ppm. The concentration of ytterbium can be between approximately 15000 to 50000 ppm. The concentration of ytterbium is preferably between approximately 20000 to 45000 ppm.

The concentration of phosphate in the core 3 can be between approximately 12 to 17 mole percent. The concentration of phosphate in the core 3 is preferably approximately 15 mole percent.

The concentration of alumina can be between approximately 0.20 to 1 mole percent. The concentration of alumina is preferably between approximately 0.3 to 0.8 mole percent.

The optical fibre 1 can be manufactured using chemical vapor deposition and solution doping. Techniques are described in U.S. Pat. Nos. 4,787,927, 4,815,079, 4,826,288, 5,047,076, and 5,151,117, which are all hereby incorporated herein by reference.

The waveguide 2 can be a multimode waveguide at a signal wavelength. The waveguide 2 can be configured to propagate single mode light without significant distortion and/or mode coupling over a substantial length. Such designs are important for the design of high power fibre lasers and amplifiers, particularly for application in spectroscopy, industrial materials processing, laser surgery, and aerospace applications. Examples of core designs, techniques to propagate single mode light, and use of bend losses to remove (at least partially) unwanted higher order modes are described in U.S. Pat. Nos. 5,818,630, 6,496,301, 6,614,975, and 6,954,575, all of which are hereby incorporated herein by reference.

The waveguide 2 can be a single mode waveguide.

Figure 3:
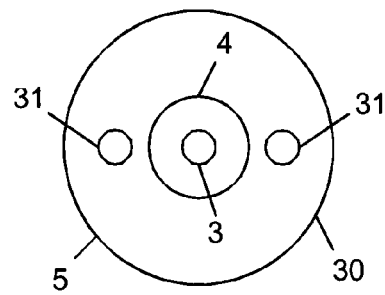
FIG. 3 shows an optical fibre that includes stress producing regions for inducing birefringence in the core.
Figure 14:
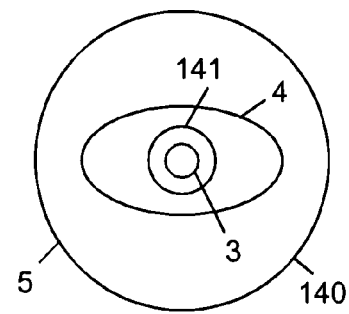
FIG. 14 shows an optical fibre that has an elliptical pedestal.

FIG. 3 shows an optical fibre 30 which includes stress producing region 31 for inducing birefringence in the core 3. The core 3 can be circular or elliptical. Alternatively, or additionally, birefringence can be induced by making at least one of the pedestal 4 and core 3 elliptical. FIG. 14 shows an optical fibre 140 having an elliptical pedestal 4 for inducing birefringence. The optical fibre 140 also includes an inner cladding 141 designed to have a higher viscosity than that of the pedestal 4. This can be achieved, for example, by including boron dopant in the pedestal 4 in order to depress its refractive index. Techniques to manufacture such birefringent fibres are described in U.S. Pat. Nos. 4,274,854 and 4,426,129, which are hereby incorporated herein by reference. It should be noted that it can be advantageous in such fibres to reduce or eliminate the dopant concentration of germania in the pedestal in order to allow the pedestal to be reshaped into an elliptical jacket. Alternatively, or additionally an additional cladding (not shown) doped with oxides of boron can be included in the fiber 1 in order to form the elliptical jacket as taught by the above patents. The optical fibres 30 and 140 can also be single polarization optical fibres which can be single mode or multimode, as described in U.S. Pat. No. 6,496,301 and co-pending and commonly-owned U.S. patent application Ser. No. 10/528,895, which patent and patent application are hereby incorporated herein by reference.

Figure 4:
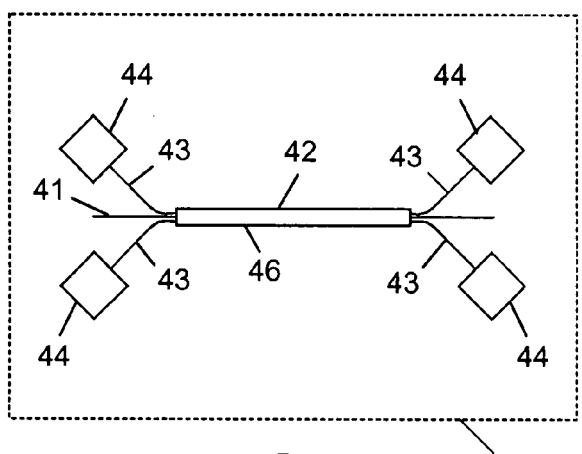
FIG. 4 shows a cladding pumped amplifying optical device.

FIG. 4 shows an apparatus in the form of a cladding pumped amplifying optical device 40 comprising pump 44 and an optical fibre 41. The optical fibre 41 can be the optical fibre 1, 30 or 140. The cladding pumped optical device 40 utilizes a composite fibre 42 comprising the optical fibre 41 and pump fibres 43 within a common coating 46. The composite fibre 42 is described in U.S. Pat. No. 6,826,335, which is hereby incorporated herein by reference. Other cladding pumped fibres and arrangements are also possible, such as those described in U.S. Pat. Nos. 4,815,079, 5,854,865, 5,864,644, and 6,731,837, all of which patents are hereby incorporated herein by reference. The embodiments described herein are particularly advantageous because signal light scattering or leaking from the low numerical aperture core 3 is preferentially captured and guided by the pedestal 4, and therefore is not routed back into the pumps 44. The apparatus therefore removes one of the major failure mechanisms of cladding pumped lasers, namely the catastrophic failure of pump diodes caused by unwanted signal light. The cladding pumped optical device 40 can be an amplifier, a laser, a master-oscillator power amplifier, a Q-switched laser or an ultra-fast laser including at least one source of pump energy. By ultra-fast laser, it is meant a laser, including for example a laser in the form of a mode locked laser and/or a master-oscillator power amplifier, that emits pulses having pulse widths less than 1 ns, and more preferably less than 10 ps. Designs and applications of ultra-fast lasers are disclosed in U.S. Pat. Nos. 6,885,683, 6,275,512, 5,627,848, 5,696,782, and 5,400,350, all of which patents are hereby incorporated by reference herein.

Figure 5:
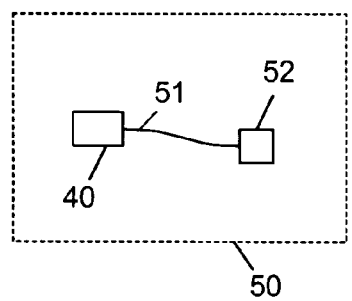
FIG. 5 shows apparatus in the form of a laser for material processing.

FIG. 5 shows an apparatus in the form of a laser 50 for material processing. The laser 50 includes the amplifying optical device 40, a laser delivery fibre 51, and a processing head 52. The processing head 52 can be a scanner, a galvanometer, or a focusing lens. The laser 50 is particularly useful for marking, microwelding, printing, micromachining and cutting of metals, plastics and other materials.

Figure 6:
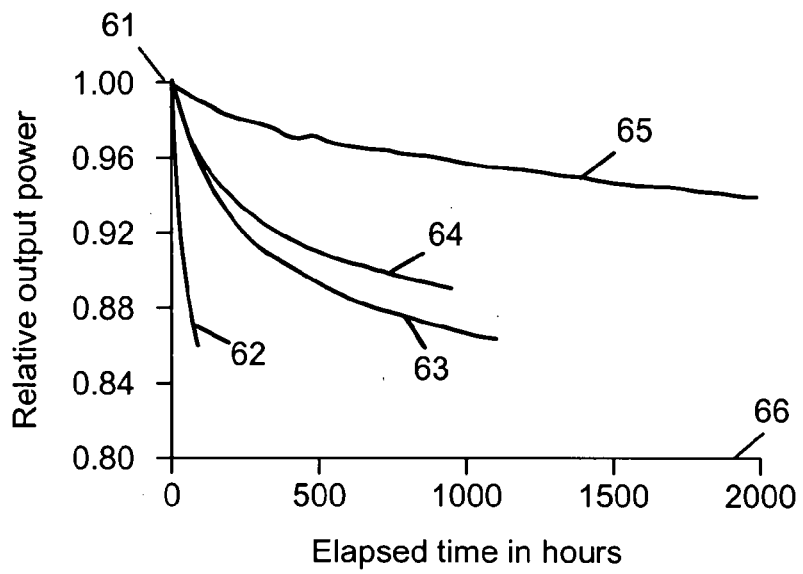
FIG. 6 shows the effect of photodarkening in four continuous-wave fibre lasers.

FIG. 6 shows the effect of photodarkening in four continuous-wave fibre lasers that each include a core 3 doped with ytterbium, alumina, germania, and oxides of boron. The figure shows a measurement of output power 61 with time 66 for four different fiber lasers. The cores 3 of each of these fiber lasers were doped with a standard commercially-available source of ytterbium dopant. Line 62 shows a measurement from a fiber laser that is doped with standard commercially-available ytterbium dopant that has a high thulium content. A rapid decrease in output power 61 is observed. Line 63 shows a measurement taken at 30 C from a fiber laser that outputs a continuous wave output power of 60 W. The fiber core 1 was doped with a standard commercially available ytterbium. Again, there is a rapid decrease in output power 61 observable. Line 64 shows a measurement taken at 70 C from a fiber laser that outputs a continuous wave output power of 110 W. Finally, line 65 shows a measurement taken at 30 C from a fiber laser that outputs a continuous wave output power of 60 W. The ytterbium dopant is high purity, with a specified impurity level of less than 1 part in $10^6$. The ytterbium dopant is high purity, with a specified impurity level of less than 1 part in $10^6$ (1 ppm). Comparing lines 63 and 65, the use of high purity ytterbium has reduced the effect of photodarkening when measured at the same levels of output power and temperature. Comparing lines 64 to 65, increasing temperature from 30 C. to 70 C. has caused an increase in photodarkening. There is clearly a significant improvement in the resistance to photodarkening achieved by utilizing Yb-dopant with very low levels of thulium and other impurities. It is believed that the remaining photodarkening effect is due to the other refractive-index-controlling core co-dopants, namely alumina, germania and oxides of boron.

Kitabayashi et al., in their paper entitled "Population inversion factor dependence of photodarkening of Yb-doped fibers and its suppression by highly aluminum doping" published in the Proceedings of Optical Fiber Communications 2006 Conference, disclose that photodarkening in Yd-doped fibers can be reduced, but not entirely eliminated, by incorporating aluminum doping.

Figure 7:
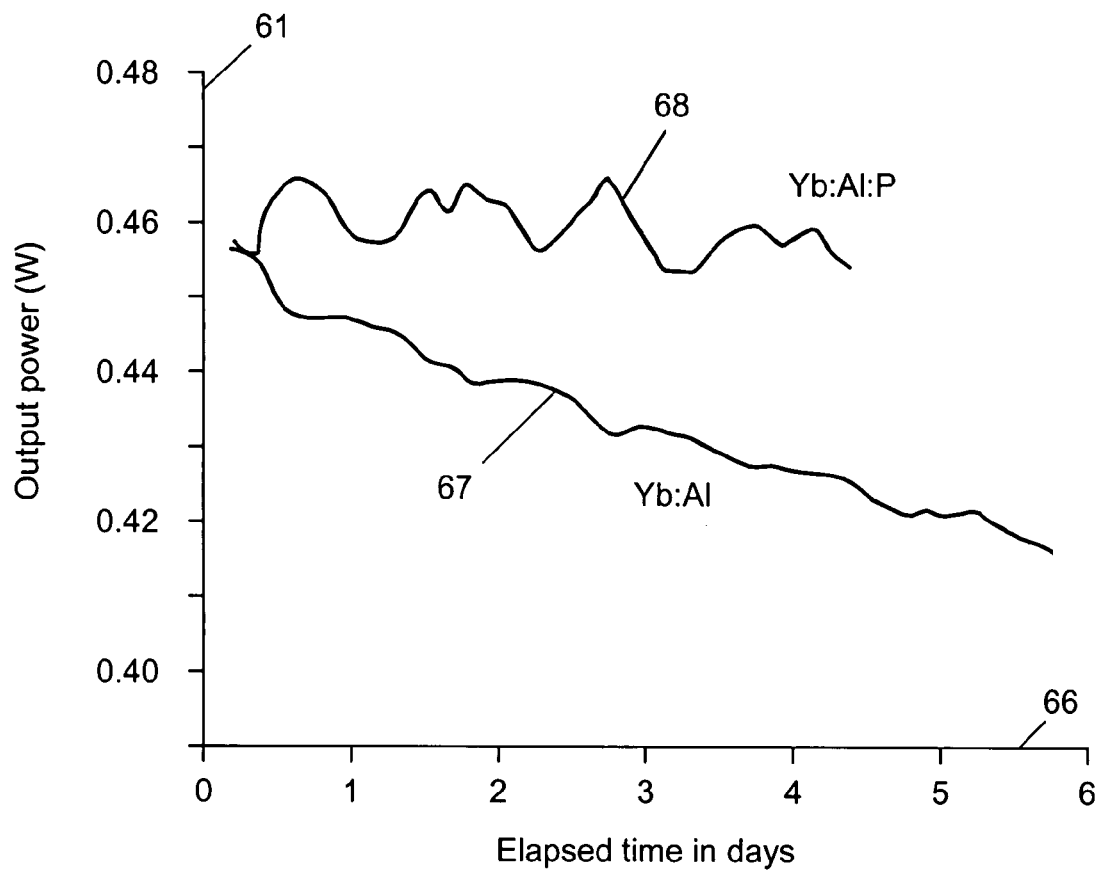
FIG. 7 shows the effect of photodarkening in alumina doped silica.

Surprisingly, the inventors have discovered that further improvements can be achieved by removing germania from the core 3 of the fibre 1 and by including phosphate dopant. FIG. 7 shows the improvement obtained by including phosphate dopant in a core 1 that had been doped with alumina. The core 1 contains no germania and no boron doping. The core 1 was doped with high purity oxides of ytterbium (total impurity content specified to be better than 1 ppm) in order to keep contamination due to thulium and other rare-earths to a minimum. Curve 67 shows the result with alumina dopant, and curve 68 shows the result with alumina and phosphate dopant. It is shown that, in accordance with the Kitabayashi et al. results, alumina on its own cannot entirely suppress the photodarkening effects. However, we have discovered that the inclusion of phosphate co-dopants in addition to alumina results in a dramatic improvement and dramatically reduces photodarkening effects in ytterbium-doped fibers. Importantly, use of alumina dopant in the core also enables low numerical aperture waveguides to be produced with higher reproducibility than with phosphate doping alone.

Figure 8:
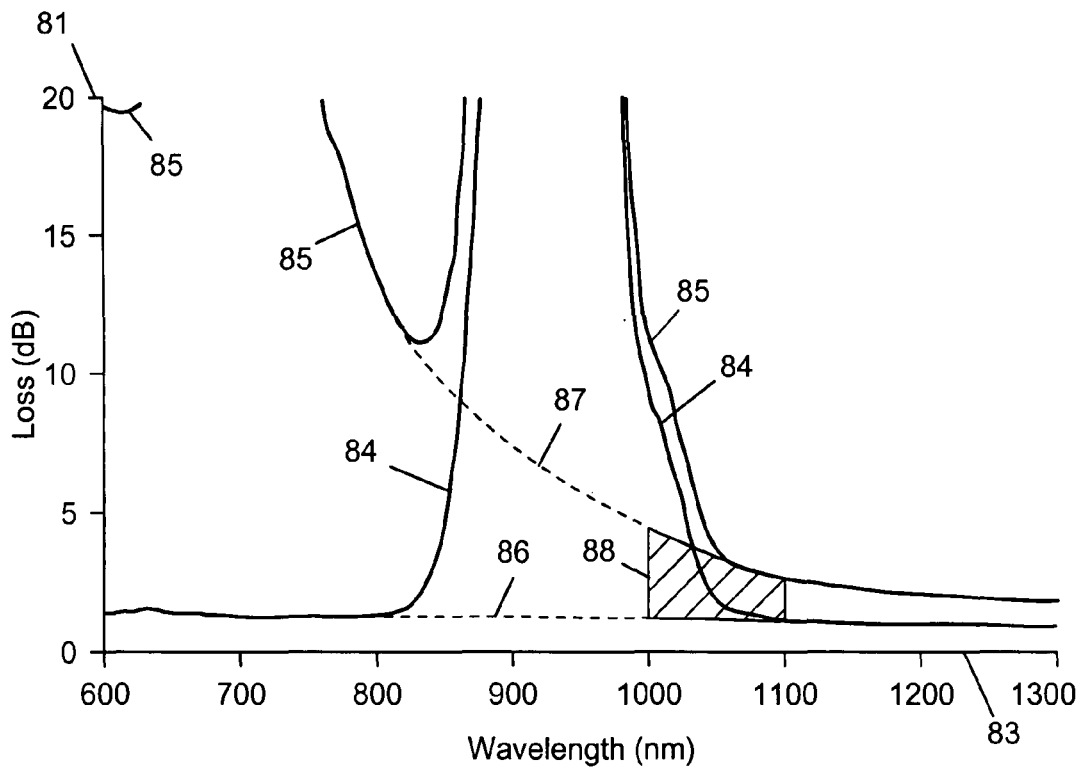
FIGS. 8 to 10 show results of accelerated ageing tests in three different fibres.
Figure 9:
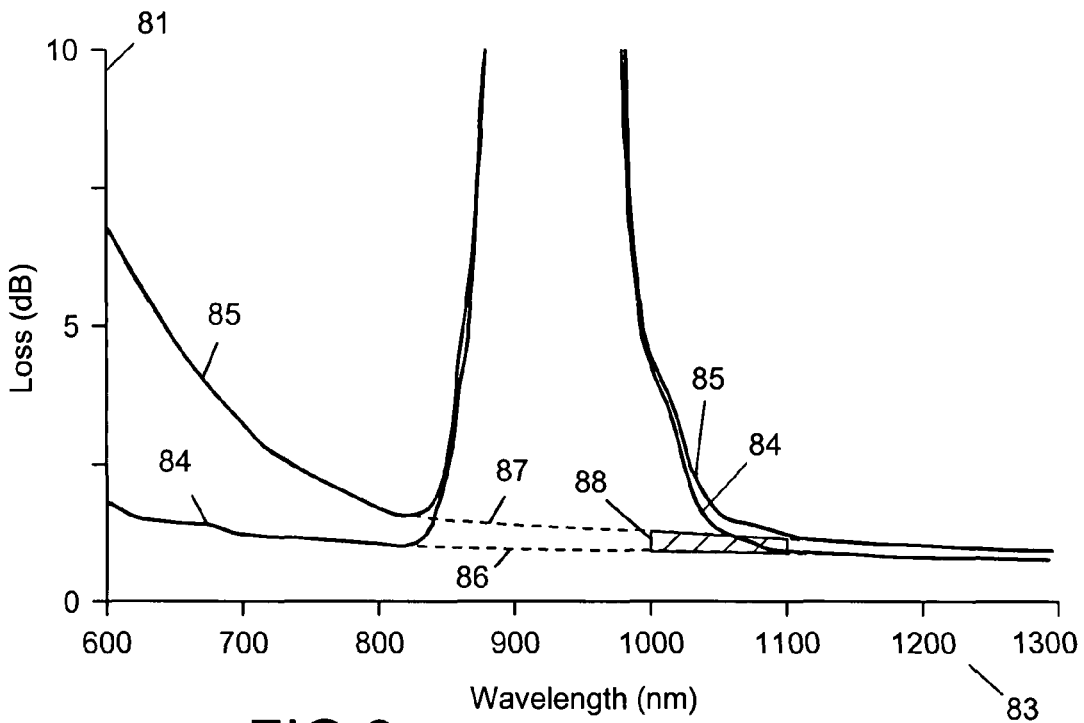
Figure 10:
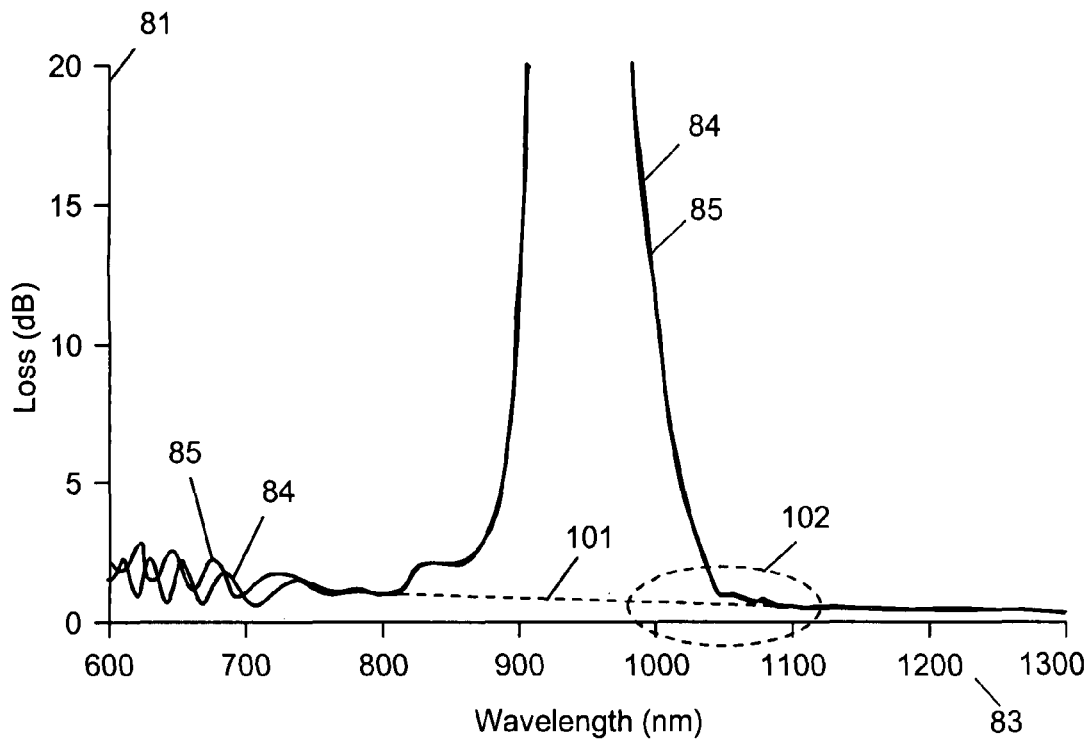

Photodarkening of optical fibres can also be characterized by monitoring the increase in absorption (around the 1 micron region of interest) of the optical fibre, subjected to an accelerated-ageing test. The ageing is accelerated by pumping the ytterbium doped core to achieve the maximum possible inversion. The measurements shown with reference to FIGS. 8 to 10 were obtained by core-pumping approximately 0.1 to 1 m lengths of the fibres with approximately 400 mW of pump light at 976 nm, and coupling white light from a tungsten filament into the core. The spectral absorption was then measured by a cut-back measurement. The measurement method follows the method published in a paper, "Photodarkening in ytterbium-doped silica fibers" by L. L. Koponen et al, Proceedings of SPIE Volume 5990. Measurements of loss 81 versus wavelength 83 were taken before and after the accelerated ageing. FIG. 8 shows the measurement of loss 81 before 84 and after 85 accelerated ageing in a fibre laser whose core was doped with high-purity Yb, germania and boron. FIG. 9 shows the same measurement using a commercially available photodarkening-resistant Yb-doped fibre. FIG. 10 shows the same measurement on a fibre laser containing the fibre 1 shown in FIG. 1. The ytterbium absorption peak from around 850 to 1050 nm is evident in each of FIGS. 8-10. For this reason, the attenuation curves 84 and 85 have been extrapolated by curves 86 and 87 (in FIGS. 8 and 9) and by curve 101 in FIG. 10 (since there is no discernable difference between curves 84 and 85). Photodarkening is evident in FIG. 8 by the increase in loss 81 which increases as the wavelength 83 reduces. A region of interest 88 is shown by the hatched area in FIGS. 8 and 9 which shows the increase in loss 81 between 1000 nm and 1100 nm. The fibre corresponding to FIG. 9 clearly shows a much smaller increase in loss than the fibre corresponding to FIG. 8. However, as evident from FIG. 10, there is no photodarkening evident in this wavelength band as evidenced by the highlighted area 102. Fibre designs according to this aspect of the present disclosure have therefore eliminated photodarkening.

Figure 11:
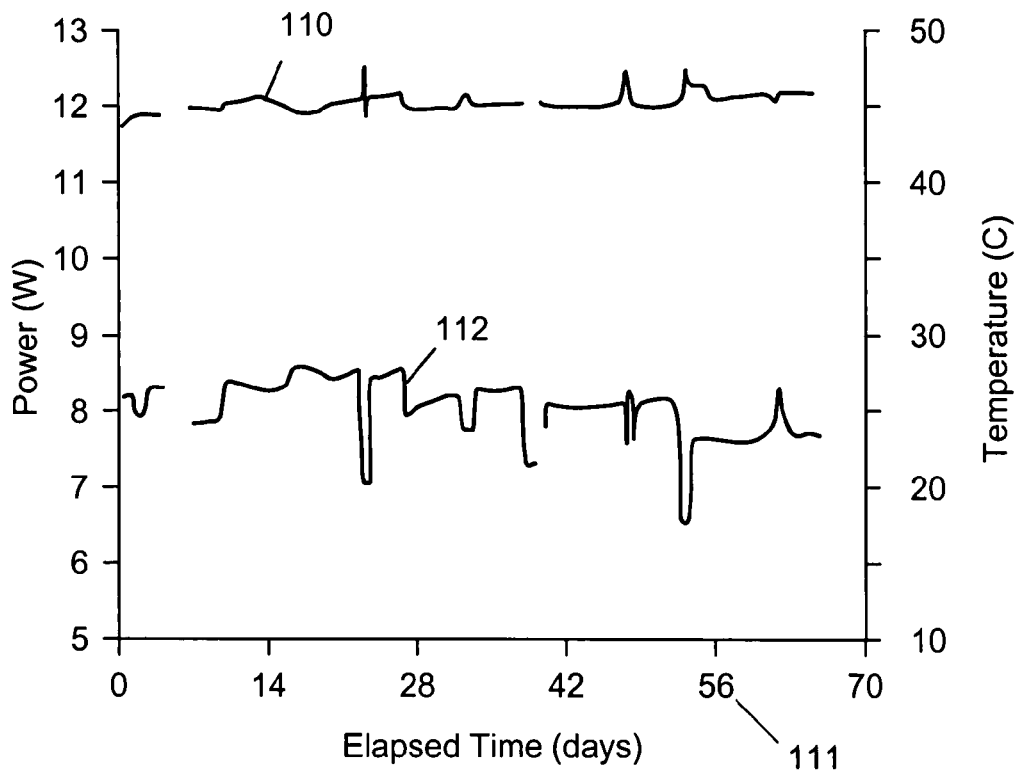
FIG. 11 shows the elimination of photodarkening effects in a master oscillator power amplifier MOPA that emits 12 W average power with 20 kHz pulses having pulse energies of 0.6 mJ and pulse widths of 35 ns.
Figure 12:
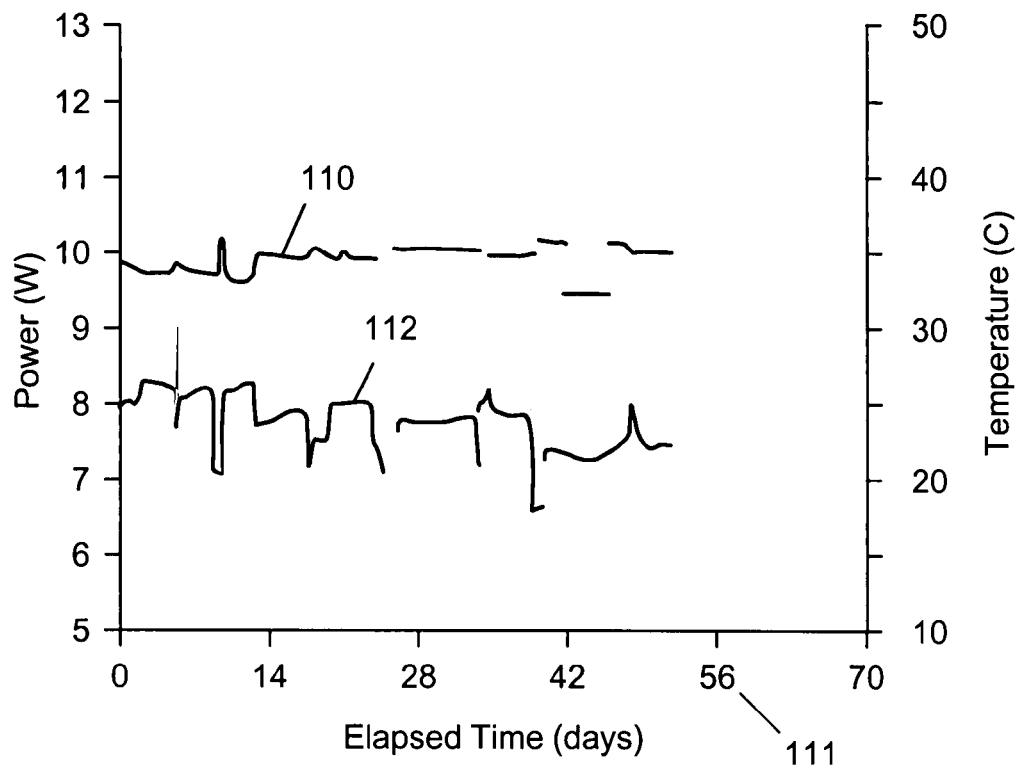
FIG. 12 shows the elimination of photodarkening effects in a fibre laser that is modulated at 10 kHz.

FIGS. 11 and 12 show the output power 110 versus time 111 from fibre lasers utilizing the fibre of FIG. 1, with dopants similar to those used in the accelerated ageing test of FIG. 10. The upper measurement line in each figure is the output power 110, whereas the lower line is the ambient temperature 112 at which the measurements were taken. The fibre laser used to obtain the results shown in FIG. 11 was a master oscillator power amplifier MOPA (not shown), emitting 12 W average power with 20 kHz pulses having pulse energies of 0.6 mJ and pulse widths of 35 ns. The fibre laser used to obtain the results shown in FIG. 12 was a continuous wave laser which was modulated at 10 kHz by turning the laser diodes used as pump sources off and on repeatedly at 10 kHz and with a 70% duty factor. No degradation of the output power 110 with time 111 is observable in either FIG. 11 or FIG. 12 over two to three months of continuous operation for both the high-peak power pulsed MOPA, and the continuous wave laser.

Figure 13:
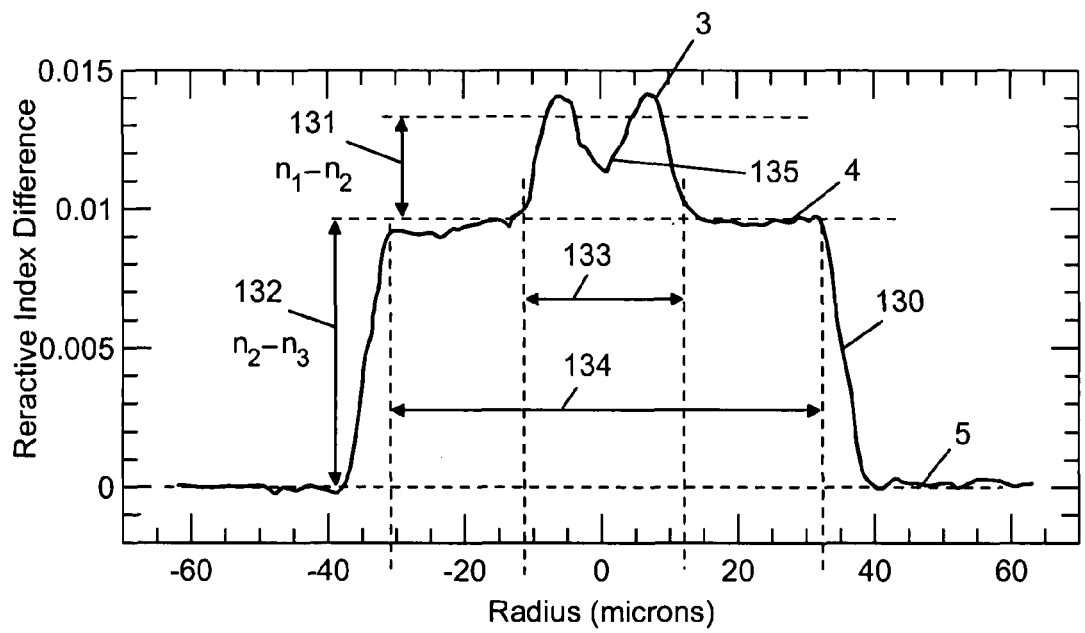
FIG. 13 shows the refractive index profile of a preferred embodiment.

FIG. 13 shows the refractive index profile 130 for a preferred embodiment. The profile 130 differs from the idealized profile of FIG. 2 in that it contains a central depression 130 in the core 3 owing to evaporation of dopants (particularly phosphate) in the collapse. The refractive index difference 131 between core 3 and pedestal 4 is given by $n_1-n_2$, which is approximately 0.0032. This corresponds to a numerical aperture of approximately 0.096. Similarly, the refractive index difference 132 between pedestal 4 and first cladding 5 is approximately 0.0097, which corresponds to a numerical aperture of approximately 0.17. The core 3 was doped with alumina with a dopant concentration of approximately 0.70 mole percent, phosphate with a dopant concentration of approximately 15 mole percent, and ytterbium with a dopant concentration of approximately 25000 ppm. The ytterbium dopant was provided by the oxide of ytterbium with an impurity content less than 1 ppm, and thus substantially no thulium dopant was included in the core 3. The pedestal 4 was doped with phosphorus and germania at levels sufficient to provide the desired core 3 to pedestal 4 refractive index 131 of approximately 0.0032. It should be noted that the pedestal refractive index difference 132 can be manufactured with high precision because the phosphate in the pedestal 4 will not evaporate during the collapse of the preform by virtue of the core 3 being deposited. Similarly, the core refractive index difference 131 can also be manufactured with high precision because unlike phosphate, the alumina dopant is relatively immune to evaporation during the collapse of the preform. The preferred embodiment thus provides a solution to the photo-darkening problem that can be manufactured with high precision and without significant evaporation of dopant from the core 3 during manufacture. The ytterbium dopant concentration of 25000 ppm can be varied to within approximately 20000 ppm and 40000 ppm. Higher values allow increased pump absorption within a fibre laser or amplifier. This has the additional advantage of reducing the required length of active fibre being used. The diameter 133 of the core 3 can be varied by oversleaving the preform during manufacture, or by other techniques known in the industry, in order to produce cores with diameters in the range 5 μm to 50 μm, or even higher (such as 100 μm if used for very high power lasers and amplifiers). The core 3 can be single mode, or multimode, and the refractive index difference 131 can be varied such that the equivalent numerical aperture is in the range approximately 0.06 to 0.15, and preferably in the range 0.08 to 0.15 by adjusting the dopant concentrations with the core 3 and/or pedestal 4. The diameter 134 of the pedestal 4 can be in the range approximately 1.5 to 5 times the diameter 133 of the core 4, preferably in the range 1.5 to 4 times the diameter 133 of the core 4, and more preferably between approximately 2.0 and 4 times the diameter 133 of the core 4. The design shown in FIG. 13 can be used as a basis for the core 3 and pedestal 4 designs of the fibres 1, 30, 41, or 140 described herein.

The use of an active fibre with a central dip (as shown in FIG. 13) in the final stage of amplification of the MOPA pulsed laser was found to be greatly beneficial in a MOPA configuration comprising a semiconductor seed laser followed by a low power pre-amplifier stage.

This was unexpected since the non-gaussian mode profile caused by the presence of the central dip has a poor matching to the fibre pigtails with respect to the modes in a flat-top refractive index. The increased signal splice losses were thought to result in reduced amplifier efficiency, defined as the ratio between the pump power used in the amplifier and the output signal power. Conversely, improved amplifier efficiency was obtained by introducing the dip in the active fibre core. High efficiency provides a significant advantage since fewer pump diodes are required to reach a desired laser output power.

An input signal power of 300 mW was used in the characterization of different active fibres. This is typical for the considered MOPA configuration with a 5-10 mW average output power from the semiconductor seed laser and ~25 dB of amplification in the pre-amplifier stage.

The measured efficiency of fibres with a flat-top index profile was 50-55% when multiple transversal modes were excited in the active fibre (Multi-Mode efficiency), and as low as 25-35% when only the lower order modes were excited (referred to as Single Mode efficiency for brevity). The latter is more relevant in fibre lasers since good output beam quality is targeted.

Fibres with a central dip, instead, showed MM efficiency of 65-70% and SM efficiency as high as 50-55%. These results were obtained for a variety of fibres presenting a different dip in the centre of the core, with a depression index change ranging from −0.003 to −0.010.

This can be explained by considering the different energy extraction efficiency of the different designs, defined as the ratio of the energy extracted from the laser medium to the maximum energy available in the medium. Energy extraction efficiency can be increased by increasing the input saturation of the active medium, i.e., by using a larger signal input power or improving the overlap of the fibre modes with the active medium. The relatively low power that can be obtained from a semiconductor seed +1 pre-amplification stage means that good overlap must be targeted.

In a flat-top fibre, the lower order modes are concentrated around the centre of the core, preventing an efficient use of the energy stored in a large amount of Yb ions near the core edge. Indeed, it is reasonable to assume that the Yb dopant profile roughly follows the refractive index profile of the core due to the high molar refractivity of Yb ions.

Conversely, the lower order mode profiles match the Yb distribution profile in a fibre with central dip. All sections of the dopant are effectively used by the input signal, resulting in better average level of saturation and better extraction efficiency. A significant advantage is theoretically found when a depression as small as −0.003 in refractive index is introduced, with negligible changes if the depression is further increased.

Additional benefits are a relaxed manufacturing tolerance in the fibre fabrication (since the dip is related to dopant evaporation in the preform collapse process, which is difficult to control) and that the central dip lowers the peak intensity of the fundamental at a given output energy, which reduces non-linear effects.

A possible drawback is given by the increased pulse reshaping in the amplifier. Better extraction efficiency results in worse pulse deformation in the amplifier, and increased peak power at the pulse leading end for the same total pulse energy. This is detrimental for both non-linear effects and pulse shape control. Optimal balance between efficiency and reshaping is obtained with a small dip (index change ~0.003), at the expense of tighter manufacturing requirements.

Figure 15:
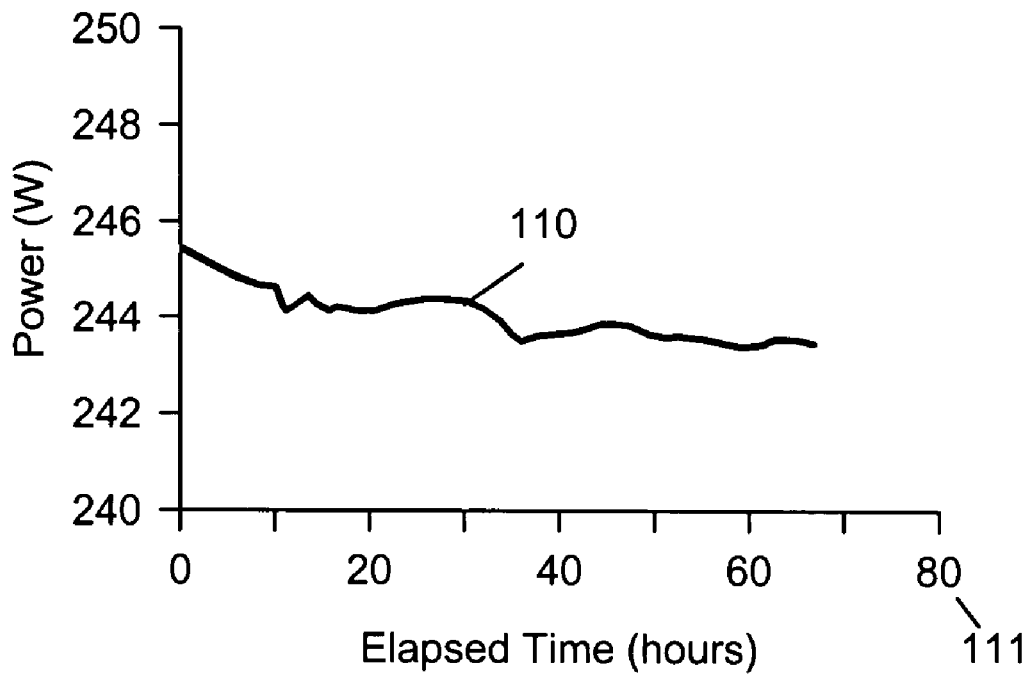
FIGS. 15 and 16 show measurements of output power in 200 W continuous wave fibre lasers.
Figure 16:
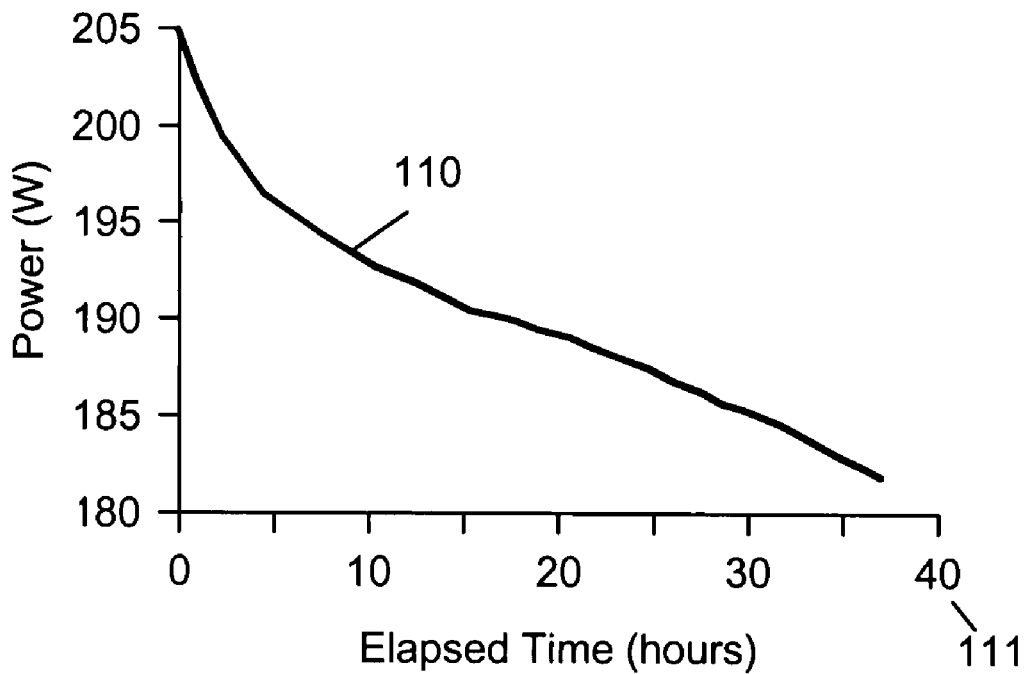

FIG. 15 shows the output power 110 versus time 111 for a continuous wave 200 W laser. The 200 W laser includes a 20 W fibre laser whose output is amplified by a 200 W optical fibre amplifier. The 200 W fibre amplifier used a fibre with a refractive index profile similar to that shown in FIG. 13. The core 3 was doped with alumina, phosphate and ytterbium. The output power 110 reduced by approximately 2 W (0.7%) in 70 hours. This small reduction can have been caused by reasons other than photodarkening. By contrast, FIG. 16 shows an equivalent result in which a more conventional step index fibre with a depressed inner cladding was used in the 200 W optical amplifier. The core was doped with alumina, boron and ytterbium. The output power 110 is seen to degrade by approximately 25 W (10%) in 35 hours. The improvement obtained by using alumina and phosphate dopant in the core is clearly demonstrated.

Experimental results have been presented which demonstrate that photodarkening occurs at mW power levels through to hundreds of Watts. Key drivers are the dopant composition, and the amount of inversion in the fibre which should be reduced as much as practical. Reducing inversion can be achieved by reducing the small signal gain at every stage throughout the optical amplifying system. Photodarkening appears to be problematical for optical gains greater than 10 dB, and especially problematical for optical gains greater than 20 dB.

The solutions described here are believed to be applicable for power levels from fractions of Watts through to many thousands of Watts, for continuous wave lasers, and pulsed lasers having pulse widths from tens of femtoseconds through to hundreds of milliseconds, for both single mode and multi-mode outputs, and for both randomly polarized and polarized outputs. Although the work described has focused on ytterbium doping, the inventors contend that the results are also applicable to fibre lasers and amplifiers based on stimulated Raman scattering, and those containing Neodymium, Ytterbium, Erbium, Neodymium, Praseodymium, Thulium, Samarium, Holmium and Dysprosium, Erbium codoped with Ytterbium, or Neodymium codoped with Ytterbium. The solutions are important for fibre lasers and amplifiers operating at wavelengths less than around 1350 nm, and especially important for fibre lasers and amplifiers operating at wavelengths less than 1100 nm. The results are also applicable for the design of beam delivery fibres (such as fibre 51 in FIG. 5), especially when the output from a fibre laser has a wavelength less than 800 nm. This can be achieved through frequency doubling or tripling, for example using non-linear crystals, waveguides, or fibres, or materials such as chirped periodically poled lithium niobate. The solutions can be used in conjunction with conventional methods to reduce photo-darkening such as using silica with high hydroxyl (OH) content, so-called "wet silica". This can be loaded with deuterium and irradiated with ultra-violet (UV) light.

Figure 17:
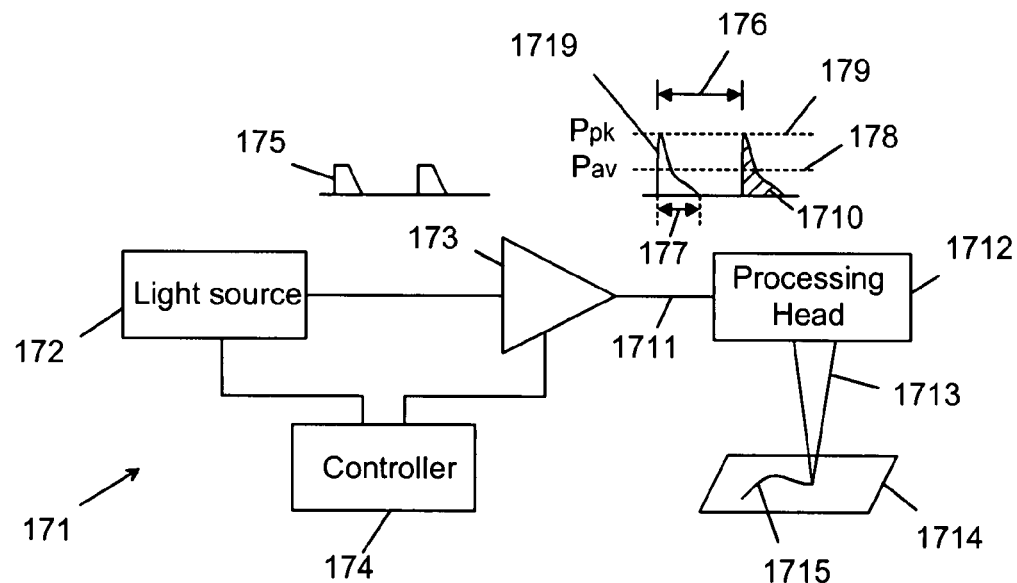
FIG. 17 show a master oscillator power amplifier (MOPA)

FIG. 17 shows apparatus 171 for providing optical radiation 1713 including a light source 172, at least one amplifier 173, and a controller 174. The light source 172 emits optical pulses 175 which are amplified by the amplifier 173 to produce output pulses 1719. The output pulses 1719 are characterized by a pulse repetition frequency 176, a pulse duration 177, a peak power 179, an average power 178, and a pulse energy 1710. The pulse energy 1710 is shown in FIG. 17 as the shaded area underneath the pulse 1719. The apparatus 171 has an optional fiber optic cable 1711 between the amplifier 173 and an optional processing head 1712 which directs the optical radiation 1713 to a material 1714. The controller 174 controls at least one of the light source 172 and the amplifier 173 such that the apparatus 171 can process the material 1714. In FIG. 17, the processing is depicted as a mark 1715. The light source 172 can include the seed laser 382 of FIG. 38. The light source 172 can also include the reflector 384 of FIG. 38. The amplifier 173 can further include the amplifier 383 of FIG. 38.

Processing can also encompass marking, printing, cutting, drilling, welding, microwelding, brazing, annealing, as well as other materials processing applications. Processing can also encompass biological processes such as tissue (such as skin) treatment, dentistry, and surgery.

The processing head 1712 can include a scanning head or galvanometer for scanning the optical radiation 1713. Alternatively or additionally, the processing head 1712 can include at least one lens for collimating and/or focusing the optical radiation 1713. Preferably (but not necessarily) the processing head 1712 can include a high power optical isolator to prevent destabilization of the amplifier 173 by back-reflections originating from the material 1714.

The disclosure provided herein can also be viewed as the material 1714 including a mark 1715 made using the apparatus 171. The material 1714 can be an article such as a semiconductor package (plastic or ceramic), a key pad on a mobile phone, iPODs, or a computer, a component, a package, or a commercial or industrial product.

Pre-amplifiers, power amplifiers, and optical arrangements that can be used in the apparatus of FIG. 17, but without the reflector 196, are described in U.S. Pat. No. 6,433,306, which is hereby incorporated herein by reference. As that patent describes, non-linear effects begin to appear as the peak power 179 of the apparatus 171 is increased. A solution proposed to avoid stimulated Brillouin scattering is to use a laser diode as the light source 2 which laser diode has multiple wavelengths so as to increase the SBS threshold by the number of multimodes present so that the stages of amplification are relatively free of SBS. The inventors have found this approach to be generally suitable for peak powers 9 less than around 1 kW to 5 kW. However, as seen below, MOPAs based on this solution are prone to random pulsing which can damage the laser. The effect is believed to be due to SBS. Solutions such as increasing the mode area of the fibres increases the SBS threshold, but it has been proven difficult to increase it above around 5 kW reliably. U.S. Pat. No. 6,433,306 does not disclose or suggest the use of the reflector 196 to increase the SBS threshold or to avoid random pulsing.

As an example of the problems posed by SBS, a laser diode having greater than 50 modes was used in an apparatus emitting 12 kW peak power. When modulated at 20 kHz for extensive periods (such as 1 hour to several months), a transient pulse was observed at the output which caused internal damage to the waveguides with the amplifier 173. The effect is believed to occur owing to random effects within the semiconductor laser resulting in occasional line width narrowing and consequential triggering of SBS. However it is not proven that the effect is due to SBS although this appears to be quite likely. Nevertheless, transient pulse damage has been found to be very difficult to quantify and remove from such devices, particularly as it occurs so infrequently.

Figure 18:
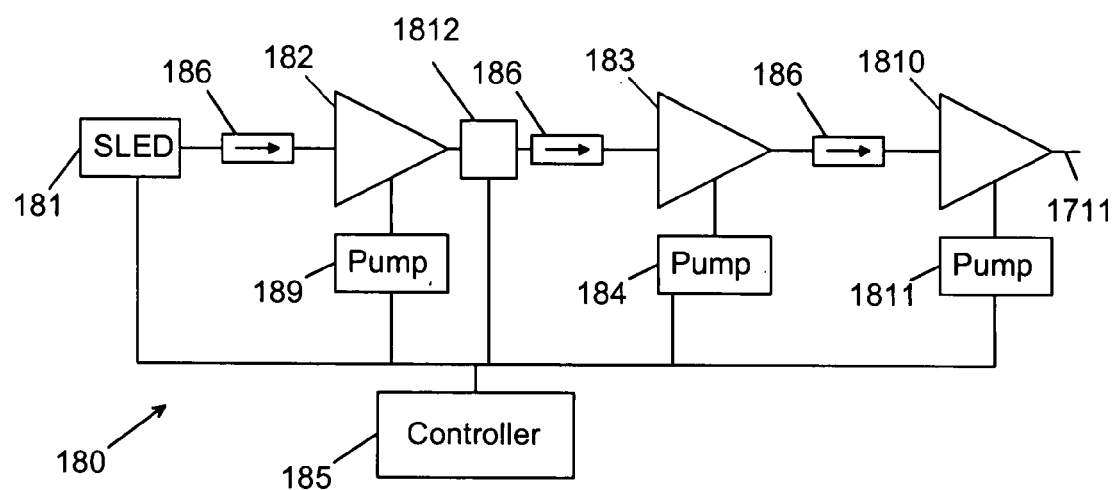
FIG. 18 shows a MOPA in which the seed is a surface emitting light emitting diode (SLED)

Surprisingly, the inventors have managed to solve this problem using the apparatus 180 of FIG. 18. The semiconductor laser has been replaced by a superluminescent diode (SLED) 181, an isolator 186 and a preamplifier 182. The preamplifier 182 is pumped by a pump 189. The output of the preamplifier 182 is coupled to an amplifier 183 via optical isolator 186, which is then coupled to a power amplifier 1810 via another optical isolator 186. The amplifier 183 and the power amplifier 1810 are pumped by pumps 184 and 1811 respectively. The pumps 189, 184 and 1811 are preferably (but not necessarily) semiconductor lasers.

Replacing the semiconductor laser with an SLED 181 is a counter-intuitive approach. This is because the SLED 181 has very much less power than semiconductor lasers. Consequently the preamplifier 182 is not saturated and generates ASE between pulses 1719 which saturates the gain of the amplifier 183 and the power amplifier 1810. ASE is generated if the pump 189 is on all the time. This is because it pumps the preamplifier 182, creating inversion and subsequent generation of ASE. The effect of ASE can be reduced by modulating the pump 189 such that it is turned off between pulses, and turned on prior to the pulses arriving from the SLED 181. The exact timing depends upon the design of the preamplifier 182 and in particular the power available from the pump 189, the higher the pump power, the less time that is required to have the pump 189 turned on. Alternatively or additionally, an optical switch 1812 can be inserted between the preamplifier 182 and the power amplifier 1810. Preferably (but not necessarily) the optical switch 1812 is inserted between the preamplifier 182 and the amplifier 183. Alternatively or additionally a filter (not shown) can be used to filter the ASE but this is not believed to be as effective as either modulating the pumps or using the optical switch 1812. The optical switch 1812 can be an acousto-optic modulator, a waveguide switch, a Kerr cell or a pockels cell.

The SLED 181 and the pumps 189, 184 and 1811 are controlled by the controller 25, which can also control the optical switch 1812 if fitted. These devices can be controlled to be in synchronism and to reduce non-linear and damage effects.

The preamplifier 182, amplifier 183, and power amplifier 1810 can be core-pumped or cladding pumped. Preferably (but not necessarily), the preamplifier 182 is a core-pumped preamplifier. This is because a core-pumped preamplifier is shorter device which is more efficient. Preferably (but not necessarily) the amplifier 183 and power amplifier 1810 are cladding pumped. Such an arrangement provides for efficient devices that can be produced with low cost.

The optical fibres contained within the preamplifier 182, amplifier 183 and power amplifier 1810 can each be solid core fibres or so-called holey fibres. They are preferably doped with rare-earth dopant such as ytterbium, erbium, neodymium, holmium, thulium or praseodymium. Preferably (but not necessarily) the optical fibres are resistant to photodarkening. Such fibres are described with reference to FIGS. 1 to 16.

Preferably (but not necessarily) the SLED 181 has a bandwidth greater than 10 nm, and preferably between 20 nm and 40 nm, or larger. The higher the bandwidth, the higher the SBS threshold, and the more reliable the apparatus of the present disclsoure.

Other broadband sources can be used as the light source 172 in FIG. 17 to replace the SLED 181, such as other forms of LEDs (such as edge emitting LEDs) and superluminescent fibre sources (such as ASE sources filtered by gratings).

Figure 19:
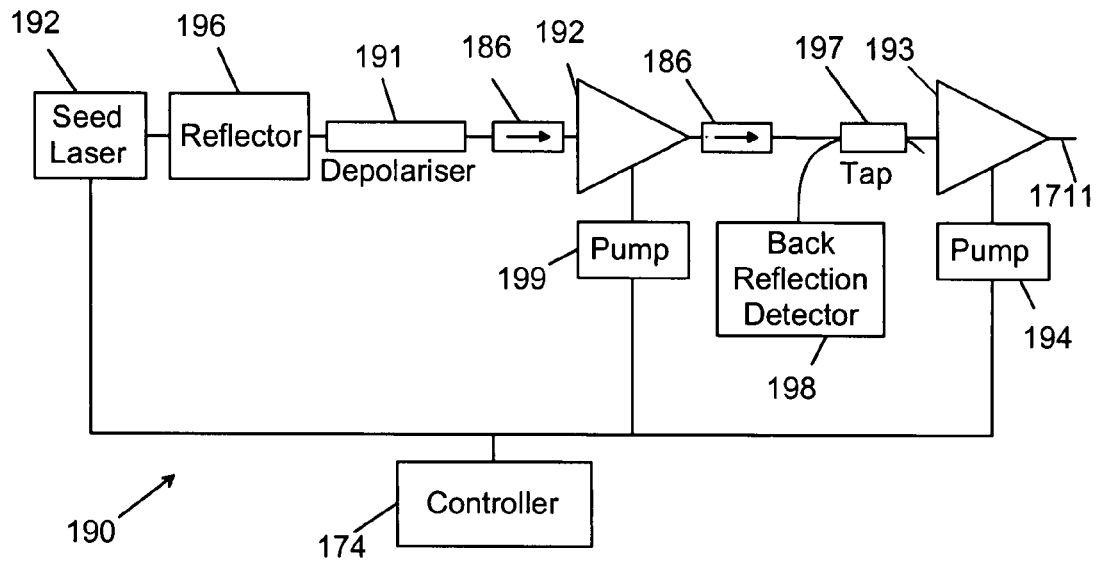
FIG. 19 shows a MOPA which includes a reflector.

The inventors have also discovered that SBS events can be prevented by using the apparatus shown in FIG. 19. The seed laser 192 is preferably the seed laser 382. The reflector 196 is preferably the reflector 384. The amplifier 193 is preferably the amplifier 383. In an experiment, the apparatus 190 included a depolarizer 191, isolators 186, a pre-amplifier 192 pumped by a pump 199, and the power amplifier 193 pumped by a pump 194. The controller 174 controlled the light source 172, and the pumps 199 and 194.

The seed laser 192 was a single transverse-mode Fabry-Perot semiconductor laser that emitted approximately 50 to 100 longitudinal modes at a centre wavelength of approximately 1060 nm. The reflector 196 was a fibre Bragg grating having a bandwidth of approximately 2 nm and which was chirped. Its reflectivity was around 4%. The depolarizer 191 comprised two lengths of polarization maintaining fibre spliced at 45 degrees to each other. Use of the depolarizer 191 is preferable in many materials processing applications (but not all) to reduce variations in processing conditions caused by polarization fluctuations. It is therefore important that the seed laser 192 has sufficient optical bandwidth to enable its emission to be depolarized. The isolators 186 were commercial off-the-shelf isolators chosen to prevent amplified spontaneous emission from being redirected back into the seed laser 192. The preamplifier 192 and power amplifier 193 were ytterbium-doped cladding pumped fibre amplifiers. The pumps 194, 199 included many single-emitter semiconductor laser diodes that were combined together. A tap coupler 197 was provided in order to monitor backward traveling optical radiation from the power amplifier 193. The tap coupler 197 and back reflection detector 198 were included for diagnostic purposes, and need not form part of a finished apparatus.

In normal operation, the seed laser 192 is pulsed to provide 10 ns to 250 ns pulses 175 at frequencies between 1 kHz and 500 kHz. At 25 kHz, the peak power from the seed laser is approximately 300 mW, the peak power from the preamplifier 192 is approximately 100 W, and the peak power from the power amplifier 193 is approximately 10 to 15 kW.

Without the use of the reflector 196, the apparatus 190 was found to suffer from catastrophic failures. A failure mechanism is characterized by a short length (up to 100 mm) of ytterbium-doped optical fibre within the power amplifier 193 destructing. The short length of fiber turns into a white powder. Another failure mechanism is a fusion splice at an end of the power amplifier failing. These and other failures can occur both during manufacturing and test, but also in a fully tested product after several months of operation.

Figure 20:
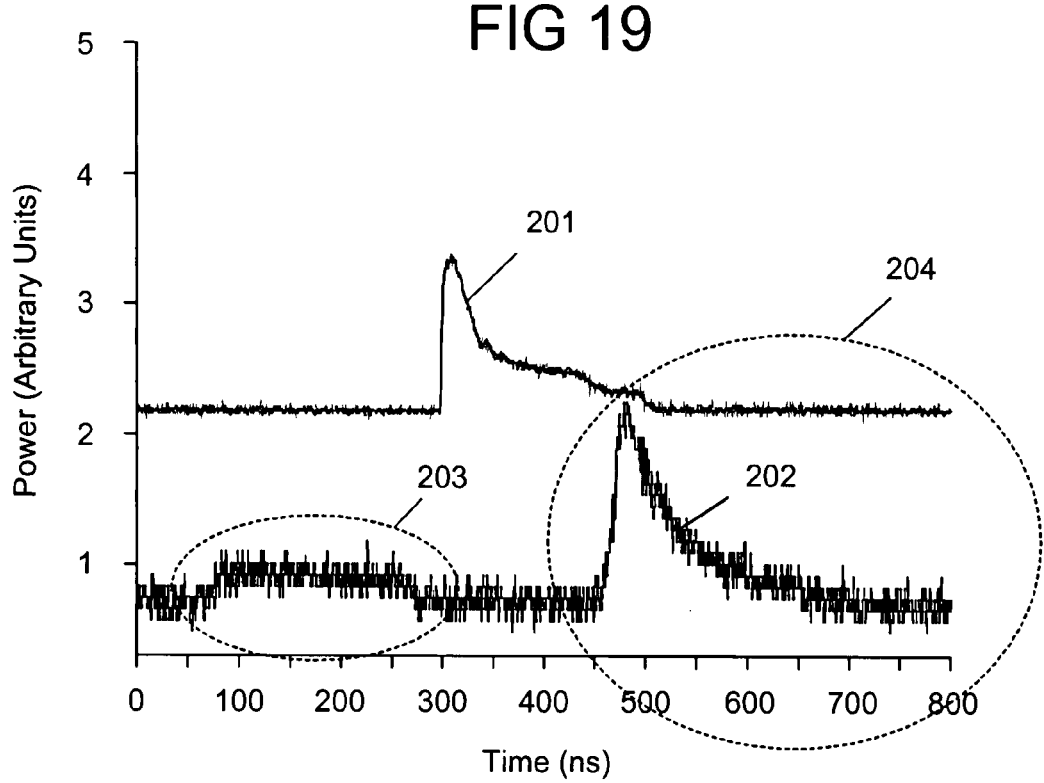
FIG. 20 shows pulse shapes in normal operation.

FIG. 20 shows the optical power 201 of the forward going pulse 1719 (measured at the output of the power amplifier 193) and the output power 202 as measured by the back reflection detector 198 in normal operation. The optical powers 201 and 202 are plotted on different scales since the output power 201 has a much higher power than the optical power 202. The output power 202 includes a first reflection 203 and a second reflection 204. The first reflection 203 originates from the splice (not shown) between the tap 197 and the power amplifier 193. The second reflection 204 originates from a reflection from the output of the fiber optic cable 1711. The pulse shapes as shown in FIG. 20 are typical of the vast majority of pulses emerging from the apparatus 190.

Figure 21:
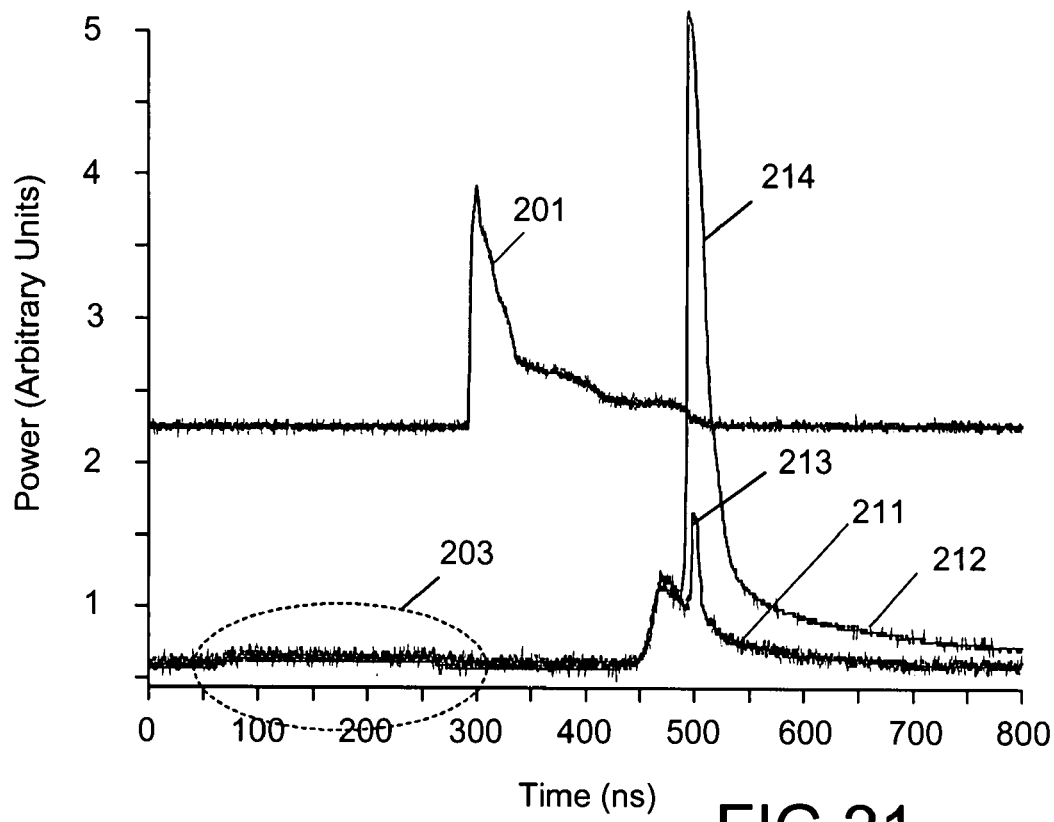
FIG. 21 shows pulse shapes containing additional spikes.

FIG. 21 shows two examples of backward traveling pulses 211, 212. The pulses 211 and 212 include the optical powers 203 and 204 as before, but also contain additional spikes 213 and 214. These additional spikes 213 and 214 occur infrequently and are random in both occurrence and in magnitude. The frequency of occurrence can be varied by changing the operating conditions of the seed laser 192 (such as temperature, drive current and pulse shape). At a pulse repetition frequency of 25 kHz, the additional spikes have been observed at a rate of between approximately 1 measured over a weekend through to 30,000 measured over a five minute period. Additionally, the rate of occurrence can be varied by using different seed lasers 192 supplied by different or the same manufacturer. Although additional spikes 213, 214 were observed in the backward traveling direction, no evidence is observable in the forward going pulse shape 201. It is contended that the spikes 213 and 214 are evidence of stimulated Brillouin scattering (SBS).

Figure 22:
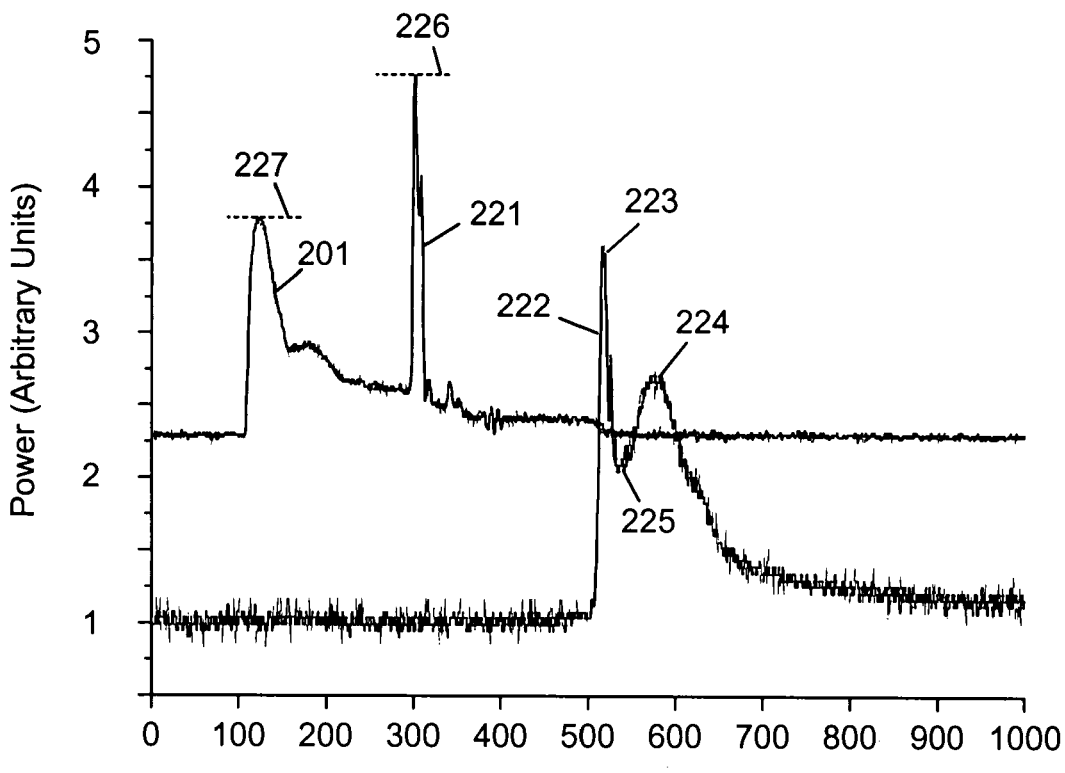
FIG. 22 shows an example of a giant pulse.

FIG. 22 shows an example of a giant pulse 221 superimposed on a normal looking pulse 201 that occurred in the forward direction. A related pulse 222 measured by the back reflection detector 198 has a complex shape and has a magnitude several orders higher than the pulse 202 shown in FIG. 20. Indeed the optical powers 203 and 204 are not visible on this scale. The pulse 222 has a spike 223, a trailing edge 224, and a dip 225. These data were obtained by setting up the apparatus 190 so that the backward spikes 213 and 214 were occurring at around 100 Hz. At this repetition frequency, the giant pulses 221 and associated pulses 222 were observed occurring at around 1 every five minutes. In other words, the giant pulses 221 are much more infrequent than the backward traveling pulses 213 and 214, and occur on a random basis.

It is contended that the dip 225 is again evidence of SBS. The backward traveling pulse 222 has sufficient energy to pump a forward going pulse via SBS. This results in the giant pulse 221 in the forward going direction which therefore extracts energy from the backward traveling pulse 222 resulting in the dip 225. All the above pulses are additionally amplified by the active gain medium in the power amplifier 193.

Referring to FIG. 22, the amplitude 226 of the giant pulse 221 shown is approximately twice the amplitude 227 of the pulse 201 (without the giant pulse 221 superimposed). The amplitude 226 varies randomly, and can be several times the amplitude 227 of the pulse 201. It is contended that the amplitude of the giant pulse 221 can be sufficient to exceed the optical damage threshold of the fiber within the power amplifier 193, and it is this, probably with additional energy caused by the acoustic wave that is associated with SBS propagation, that caused the random and unpredictable catastrophic failures described above. However this explanation is based on theory, and our attempt to describe a possible failure mechanism is not intended to limit the scope of the present disclosure.

Figure 23:
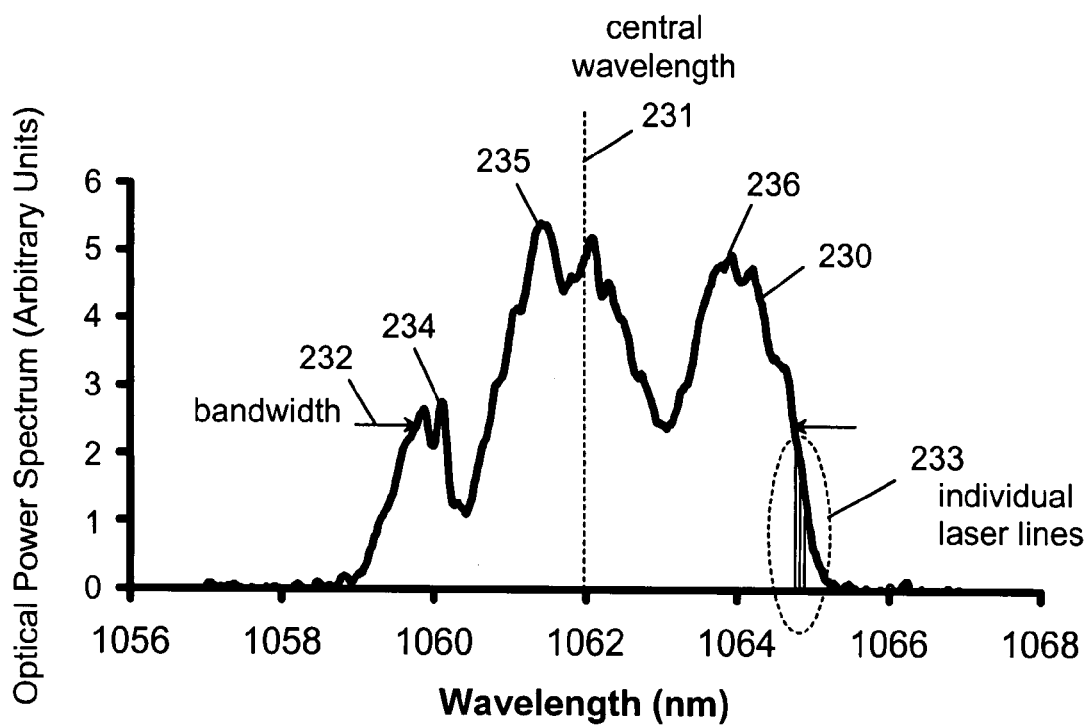
FIG. 23 shows a typical spectrum from a laser diode.

FIG. 23 shows a typical spectrum 230 from the seed laser 192. The centre wavelength 231 is approximately 1062 nm, and it is an overall bandwidth 232 of approximately 6 nm. The spectrum 230 includes approximately 150 laser lines 233 (not all shown) that are separated by approximately 0.045 nm. The spectrum 230 includes three families 234, 235, 236 of the laser lines 233 that have been observed to vary as the pulse 1719 evolves. In particular, the first family 234 is dominant at the first stages of the pulse duration 177 (during which the pulse 1719 chirps), and the central family 235 becomes more dominant thereafter.

Figure 25:
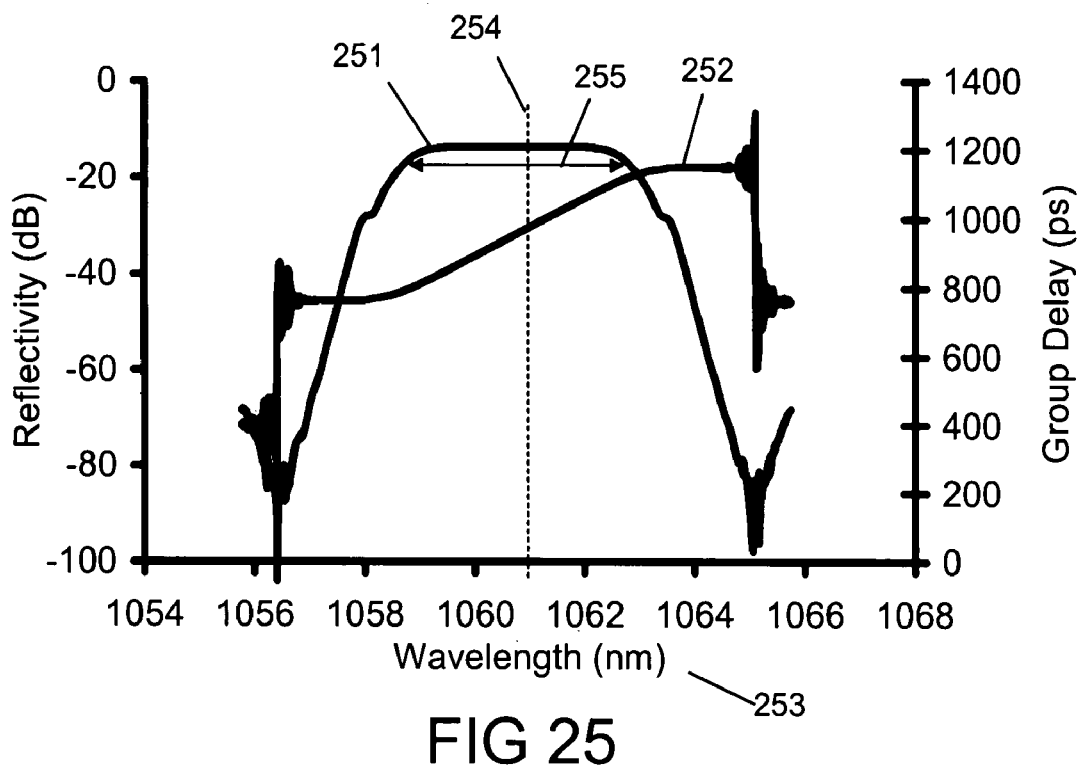
FIG. 25 shows the design of a fibre Bragg grating used as the reflector.
Figure 26:
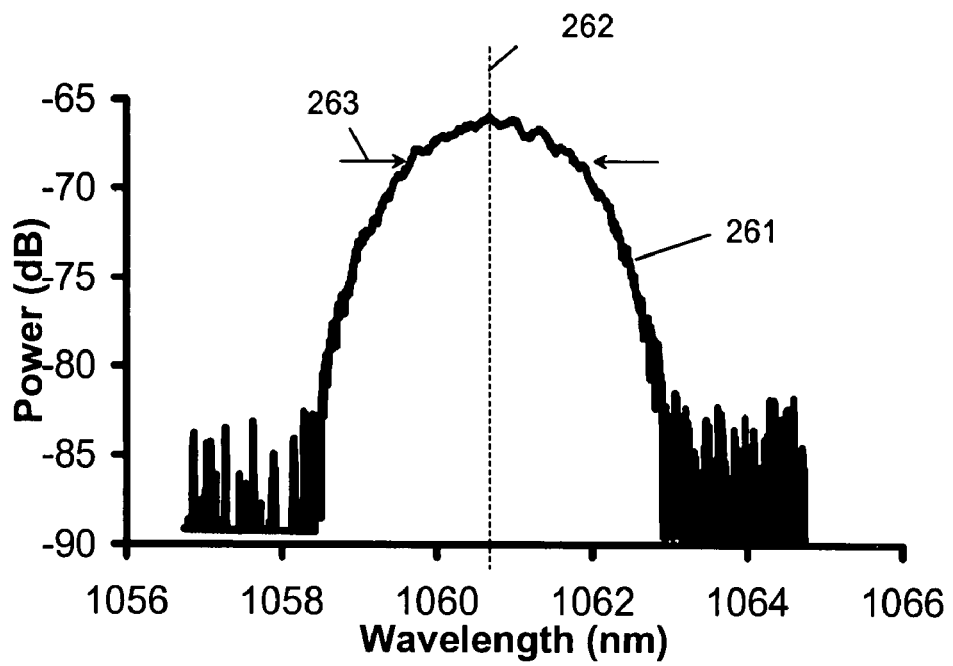
FIG. 26 shows the measured reflectivity of the fibre Bragg grating.

FIG. 25 shows the design of the fibre Bragg grating 250 (not shown) used as the reflector 196 in the apparatus of FIG. 19. FIG. 25 shows the reflectivity 251 (left axis) and group delay 252 (right axis) plotted as a function of wavelength 253. The group delay 252 is offset from zero. The offset is arbitrary as the group delay 252 depends upon the position at which it is measured. There is noise on both reflectivity 251 and group delay 252 curves which is mathematical in nature owing to computations involving very small numbers. The grating 250 is chirped with a bandwidth 255 of approximately 4 nm. Its central wavelength 254 was designed to be 1061 nm, aligned approximately within the central family 235 of FIG. 23. FIG. 26 shows the measured reflectivity 261 of the grating 250. The central wavelength 262 is approximately 1060.7 nm, and the bandwidth 263 is approximately 2 nm. The bandwidth 263 is less than the design bandwidth 255 because of detuning effects in the manufacture of the grating 250. These effects are known by those skilled in the art of fiber grating manufacture. Techniques to design and manufacture such gratings are described in U.S. Pat. Nos. 6,445,852 and 6,072,926, hereby incorporated herein by reference.

It should be noted here that the purpose of adding the grating 250 was not to stabilize the emission from the laser diode 2. Narrowband gratings (bandwidth less than around 0.5 nm, and often less than around 0.1 nm) are often incorporated into laser diode packaging in order to lock the emission wavelength, to prevent mode partition noise, to reduce the amplitude of side modes (so-called side-mode suppression), and/or to narrow the linewidth. All such purposes would tend to result in a more stable emission which (it is contended) would promote SBS and increase the frequency of occurrence of the giant pulses, and would therefore not avoid the catastrophic failures of the apparatus 190.

Figure 24:
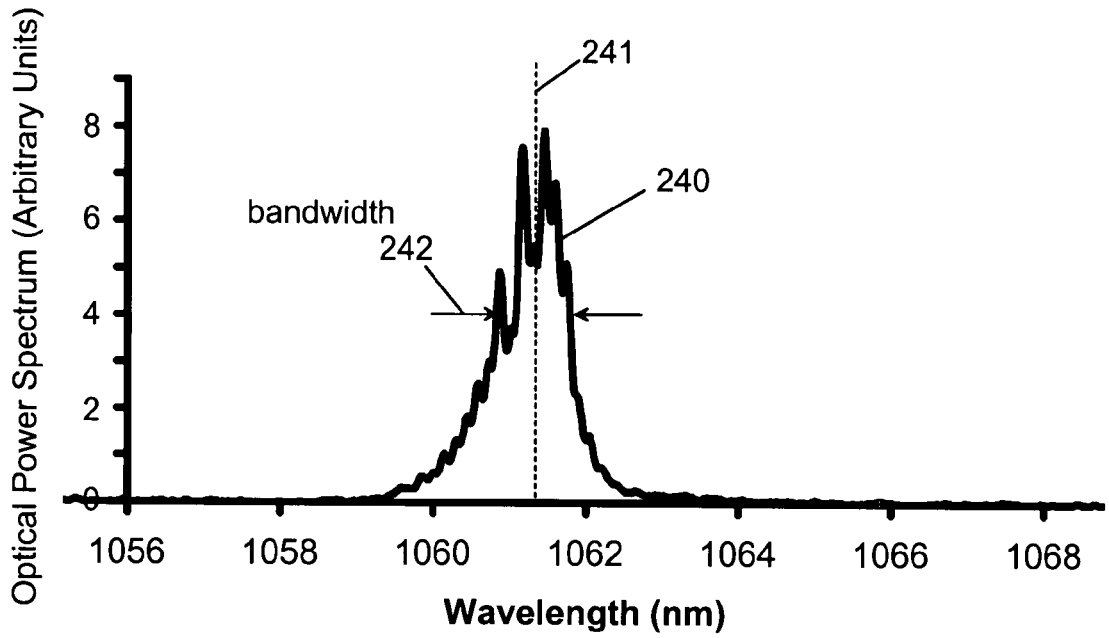
FIG. 24 shows the spectrum of the laser diode with the reflector in place.

FIG. 24 shows the spectrum 240 of the laser diode 2 measured with the grating 250 in place. The central wavelength 241 is approximately 1061 nm. The spectrum 240 has a bandwidth 242 that is less than the bandwidth 232 of the spectrum 230. The bandwidth 242 is approximately 2 nm, being determined by the optical feedback from the grating 250. In accordance with the teaching of U.S. Pat. No. 6,433,306, such a narrowing of the bandwidth would be expected to degrade the SBS performance. Surprisingly, the use of the grating 250 has eliminated both the backward traveling random pulses 213 and 214, and also the associated and more random forward-traveling giant pulses 221. The apparatus 190 has been found to be failure free. Additional experiments with other laser diodes, and with and without the depolarizer, have confirmed the beneficial effects of including the reflector 196 in the apparatus 190. The grating 250 has shown to provide reliable operation for pulsed lasers having at least 10% of the optical radiation in a single transverse mode and having peak powers in the range 1 kW to 40 kW.

It is contended that higher peak powers can be achieved up to 100 kW or more without SBS causing a problem.

It is contended that the grating 250 has destabilized the seed laser 192 (in this case a laser diode). That is, the individual laser lines 233 are broadened, chirped or are being modulated such that the conditions for SBS generation in the power amplifier 193 are avoided. Other methods to avoid SBS generation are to implement the reflector 196 as a broadband reflector such as a partially reflecting mirror or surface, which can be coupled in via an optical fiber coupler, or a grating having a bandwidth greater than 0.5 nm, preferably greater than 1 nm, and more preferably greater than 2 nm. The grating 250 is preferably (but not necessarily) chirped. The chirped grating 250 can provide a wavelength dependent effective external cavity length which is contended to contribute further to the spectral broadening of the seed laser 192. The chirped grating 250 is preferably inscribed in a polarization maintaining optical fiber with its polarization axes aligned or at an angle to the polarization axes of the seed laser 192 polarization maintaining fiber pigtail. The grating 250 can equally be inscribed in a non-polarization maintaining fiber. Also, the seed laser 192 pigtail need not necessarily be polarization maintaining fiber. The reflector 196 can be positioned to reflect laser radiation into either the front or back facets (not shown) of the seed laser 192. The reflector 196 can also include dielectric coatings. The reflectivity of the reflector 196 can be between approximately 0.1% and 10%. Results showing no pulses 213, 214 have been obtained with reflectivities as high as 34%; however pulse distortion was observed at these levels. Preferably the reflectivity is approximately 2% to 6%. The exact number will depend upon the specific laser diode being, used and can be found by experimentation. It is contended that the reflectivity of the reflector 196 should be higher than the reflectivity used in the front facet of the seed laser 192. It is also contended that the bandwidth of the seed laser 192 is preferably comparable to or smaller than the bandwidth of the reflector 196. This was not the case in the experiments described above, and therefore the operating conditions (temperature and drive current) of the seed laser 192 needed to be set up for different batches of seed lasers 192. Alternatively or additionally the bandwidth of the grating reflector 196 can be increased to include the entire bandwidth of the seed laser 192 and manufacturing tolerances of the emission wavelengths. Note also, the provision of the tap 197 enables such a set up since the complete absence of backward traveling pulses is a reliable indication of reliable operation.

The grating 250 was positioned between 40 cm and 1 m from the seed laser 192. No difference in performance was observed. It is therefore contended that the exact position is not critical, provided that the distance is not so large that there is insufficient time to stabilize the seed laser 192 with reflective feedback.

The seed laser 192 and the pumps 199 and 194 are controlled by the controller 25. Further information on the use of the controller to control the pulse shape of the optical pulses 1719, and the application and use of the apparatus in materials processing is described in co-pending U.S. Provisional Patent application Ser. No. 60/812,164, which is hereby incorporated herein by reference.

The preamplifier 192 and power amplifier 193 can be core-pumped or cladding pumped. The preamplifier 192 can be a core-pumped preamplifier. A core-pumped preamplifier is a shorter device than a cladding-pumped preamplifier and is more efficient. Alternatively, the preamplifier 192 can be a cladding-pumped preamplifier. This is preferable in order to reduce cost. Preferably (but not necessarily) the power amplifier 193 is cladding pumped. Such arrangements provide for efficient devices that can be produced with low cost. The design and construction of cladding pumped amplifiers are described in U.S. Pat. No. 6,826,335, which is hereby incorporated herein by reference.

The optical fibres contained within the preamplifier 192 and power amplifier 193 can each be solid core fibres or so-called holey fibres. They are preferably (but not necessarily) doped with rare-earth dopant such as ytterbium, erbium, neodymium, holmium, thulium or praseodymium. Preferably (but not necessarily) the optical fibres are resistant to photodarkening. Such fibres are described with reference to FIGS. 1 to 16.

Referring to FIGS. 17 and 19, the apparatus 190 of FIG. 19 can be used to replace the light source 172 and amplifier 173 of FIG. 19. As detailed below, the controller 174 controls the seed laser 192 and the pumps 194 that pump the pre-amplifier 192 and amplifier 193 such that the average power 178 and peak power 179 are maintained at levels sufficient to process materials 1714 over a range of pulse repetition frequencies 176.

Figure 27:
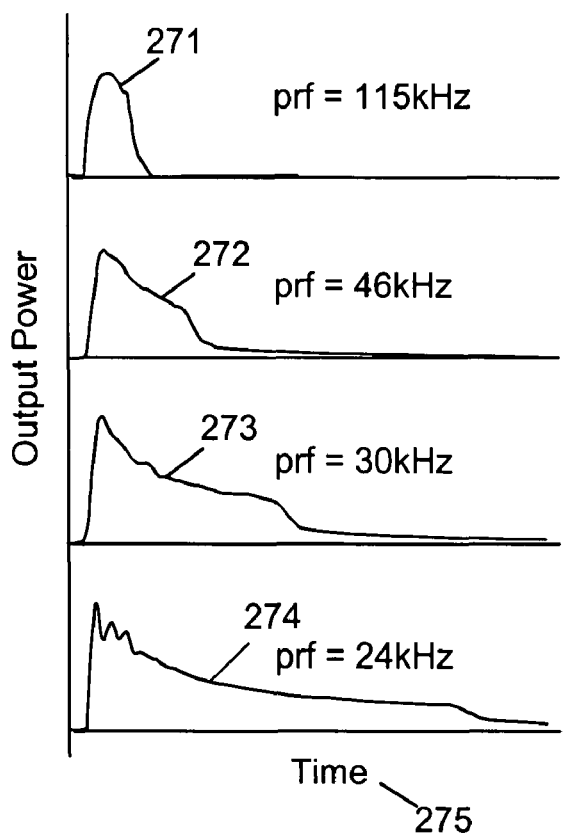
FIG. 27 shows output pulses for different repetition rates.
Figure 28:
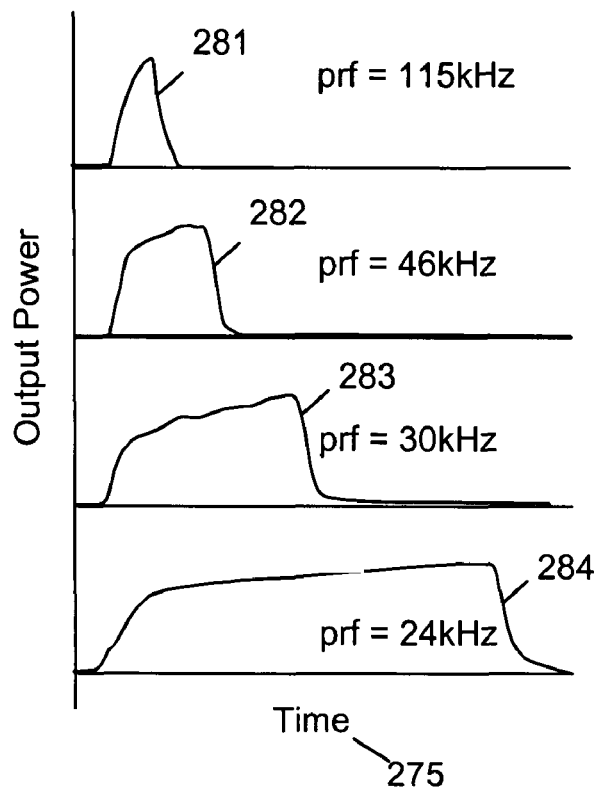
FIG. 28 shows the corresponding pulses emitted by the seed laser.
Figure 29:
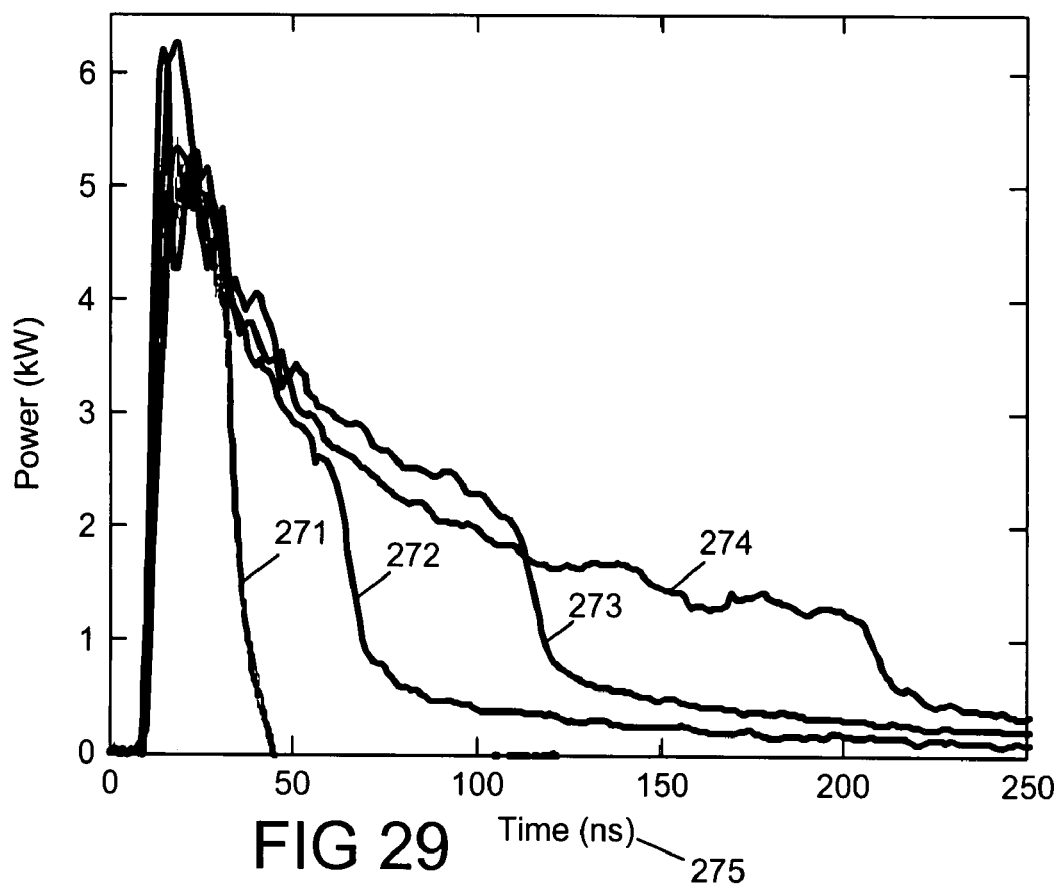
FIGS. 29 and 30 show the pulses shown in FIGS. 27 and 28 respectively superimposed.
Figure 30:
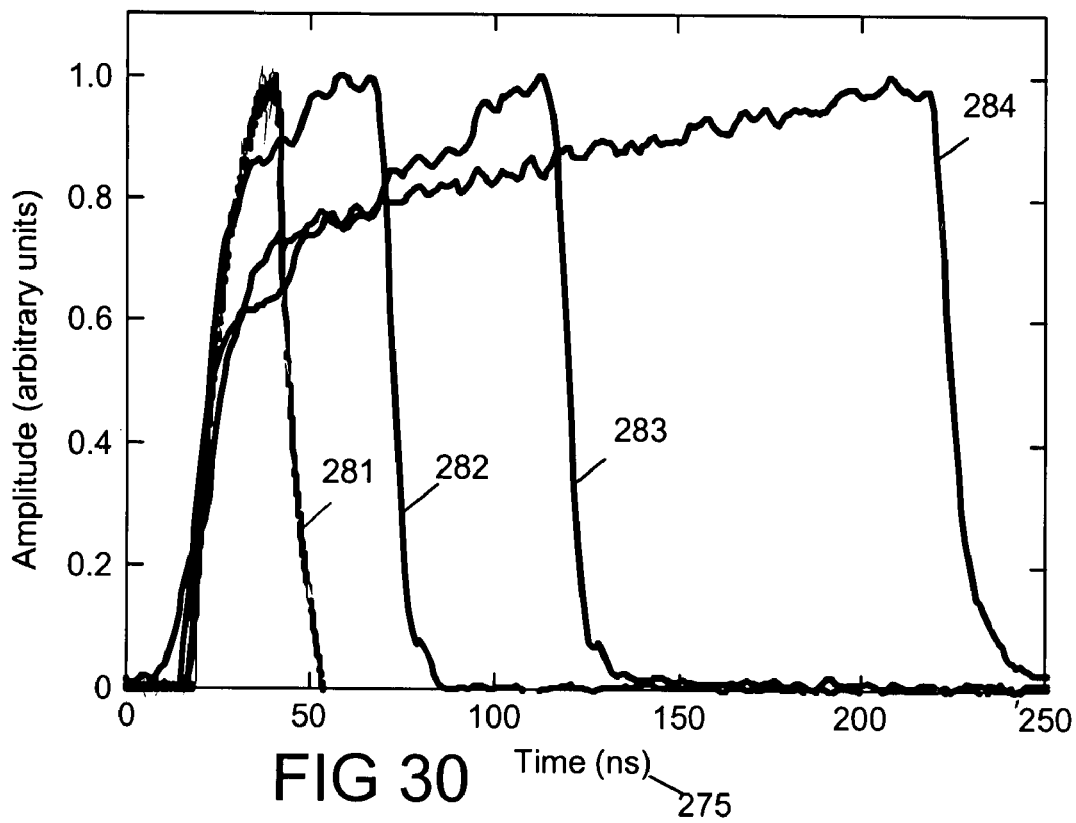
Figure 31:
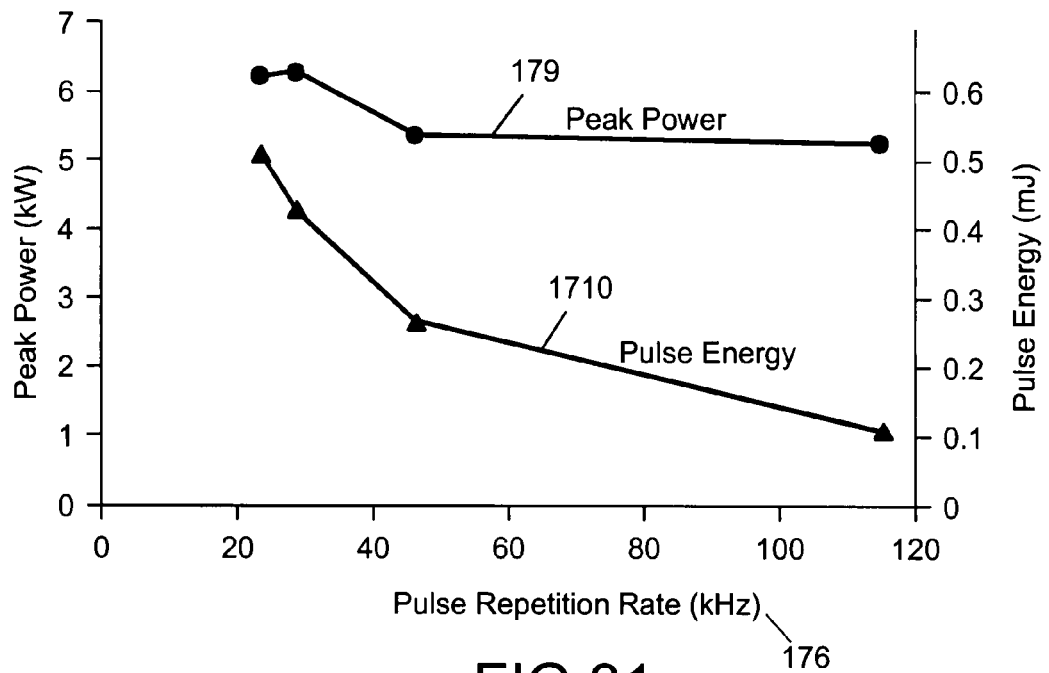
FIG. 31 shows the variation of peak power and pulse energy with repetition frequency.

FIG. 27 shows output pulses 271, 272, 273 and 274 versus time 275 for pulse repetition rates of 115 kHz, 46 kHz, 30 kHz and 24 kHz respectively. The corresponding optical pulses 175 emitted by the seed laser 192 are shown as pulses 281, 282, 283 and 284 respectively in FIG. 28. Output pulses 271 to 274 and optical pulses 281 to 284 are reproduced in FIGS. 29 and 30 respectively where the respective pulses are superimposed. FIG. 31 shows the variation of peak power 179 and pulse energy 1710 with pulse repetition frequency 176. The peak power 179 is maintained above 5 kW and the pulse energy 1710 is maintained above 0.1 mJ for pulse repetition frequencies 176 between 24 kHz and 115 kHz. Moreover, since the average power 178 is the product of pulse repetition frequency 176 and pulse energy 1710, the average power 178 can be seen to be greater than approximately 10 W for pulse repetition frequencies 176 between 24 kHz and 115 kHz. The results shown in FIGS. 27 to 31 are very significant because it has proven possible to achieve peak powers of 5 kW with pulse energies of 0.1 mJ at a pulse-repetition frequency of greater than 100 kHz with only two stages of amplification. The MOPA 190 will have great utility in increasing processing speeds compared to other fibre-optic pulse laser systems of comparable average output power 178.

Figure 32:
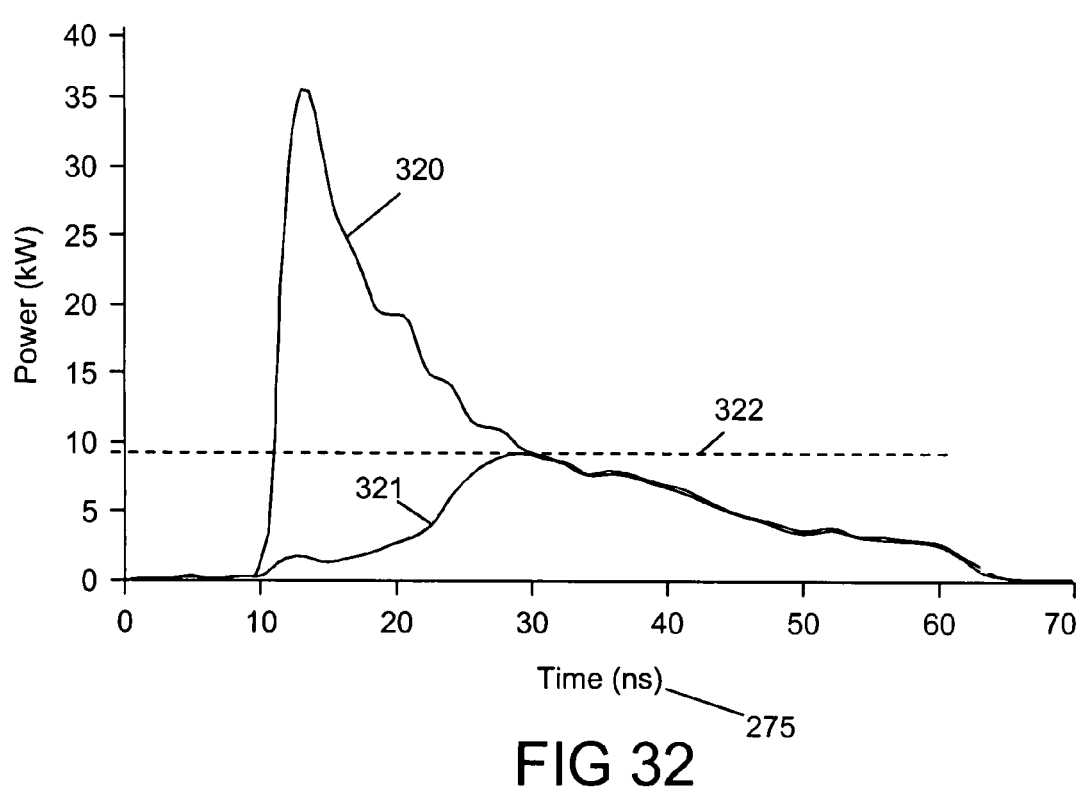
FIG. 32 shows the output power from the MOPA as the pump power is increased.
Figure 33:
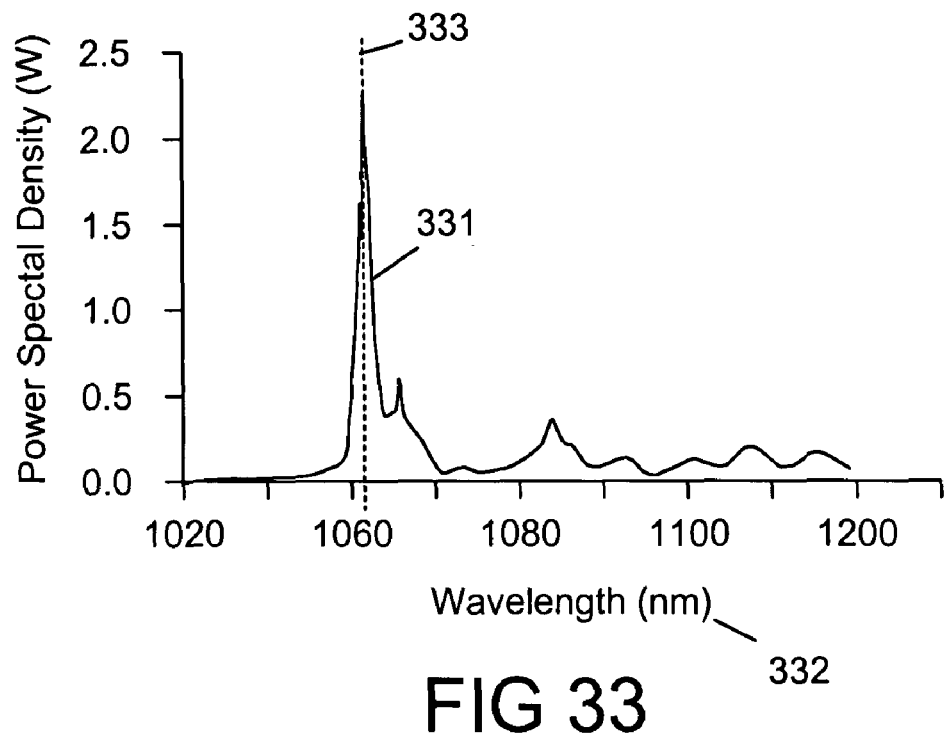
FIG. 33 shows the optical spectrum of the pulse shown in FIG. 32.

FIG. 32 shows the output power 320 from the MOPA 190 with increased power from the pumps 194. A peak power of 35 kW is achieved with a pulse width of around 10 ns (measured at half the peak power). FIG. 33 shows the optical spectrum 331 of the pulse which is shown plotted versus wavelength 332. The signal wavelength 333 of the pulse from the seed laser 192 was approximately 1062 nm. There is a significant proportion of the power at wavelengths longer than the signal wavelength 333, which power has been wavelength shifted due to non-linear processes such as stimulated Raman scattering. Referring back to FIG. 32, the output power 321 was measured using an optical filter that attenuated wavelengths greater than 1070 nm. It is seen from FIGS. 32 and 33 that output powers greater than approximately 8 kW are shifted in wavelength. The 8 kW output power can be defined as a non-linear threshold 322. Use of the MOPA 190 for the processing of materials can thus require the use of wide band optics within the processing head 1712 of FIG. 17. By "wide band optics" it is meant optics that can transmit and focus signal wavelengths having a bandwidth greater than approximately 100 nm. Nevertheless, the MOPA 190 operating in this mode has great utility for the processing of materials that require peak powers 179 greater than around 8 kW.

The controller 174 can be used to reduce the proportion of the output pulses 1719 that is wavelength converted by reducing the power emitted by the pumps 194 and 199, or by controlling the shape of the output pulses 1719. The proportion that is wavelength converted can be reduced to less than 50%, and preferably less than 10%. Preferably (but not necessarily) substantially none of the output pulses 1719 are wavelength converted over a wide range of pulse repetition frequencies 176 such as was demonstrated by reference to FIGS. 27 to 31. The control function of the controller 174 can be effected either by open loop control (for example achieved through experimentation and characterization), or be closed loop control in which a measurement of power (average power or peak power or a wavelength shifted power) is taken from a point within the MOPA 190 (for example at the input or output of the amplifier 193 or elsewhere), compared with a desired value, and the difference between the measurement and the desired value used to modify the control function provided by the controller 174.

FIGS. 34 to 37 show the effect of varying the pulse repetition frequency (prf) 176 and pulse width 177 has on the shape of the output pulse 1719 in a MOPA 190. All four figures are plotted on the same scales with the output power being plotted in arbitrary units. The controller 174 controlled the pumps 194 and 199 such that the average power 178 was maintained at 12 W. The controller 174 also set the pulse repetition frequency 176 to its desired value. The controller 174 then varied the pulse width 177 (i.e., the overall pulse width of each pulse 1719) to set the peak power 179 at desired values.

Figure 34:
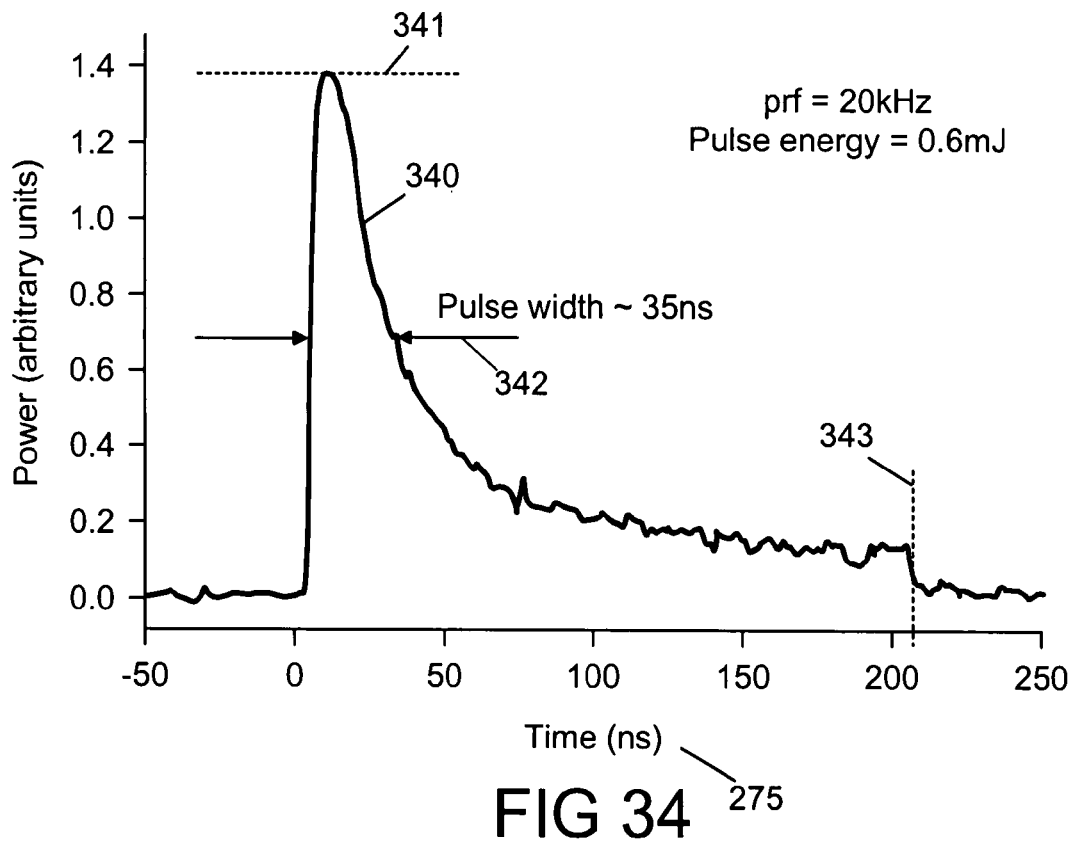
FIGS. 34 to 37 show the effect of varying the pulse repetition frequency and pulse width on the shape of the output pulse.

FIG. 34 shows the output power 340 versus time 275 measured with a pulse repetition frequency 176 of 25 kHz, a pulse energy 1710 of 0.6 mJ, and an average power 178 of 12 W. The pulse width 343 (i.e., the overall pulse width as controlled by the controller 174) was approximately 200 ns. The output power 340 has a peak power 341, and a full width half maxima pulse width 342 of approximately 35 ns.

Figure 35:
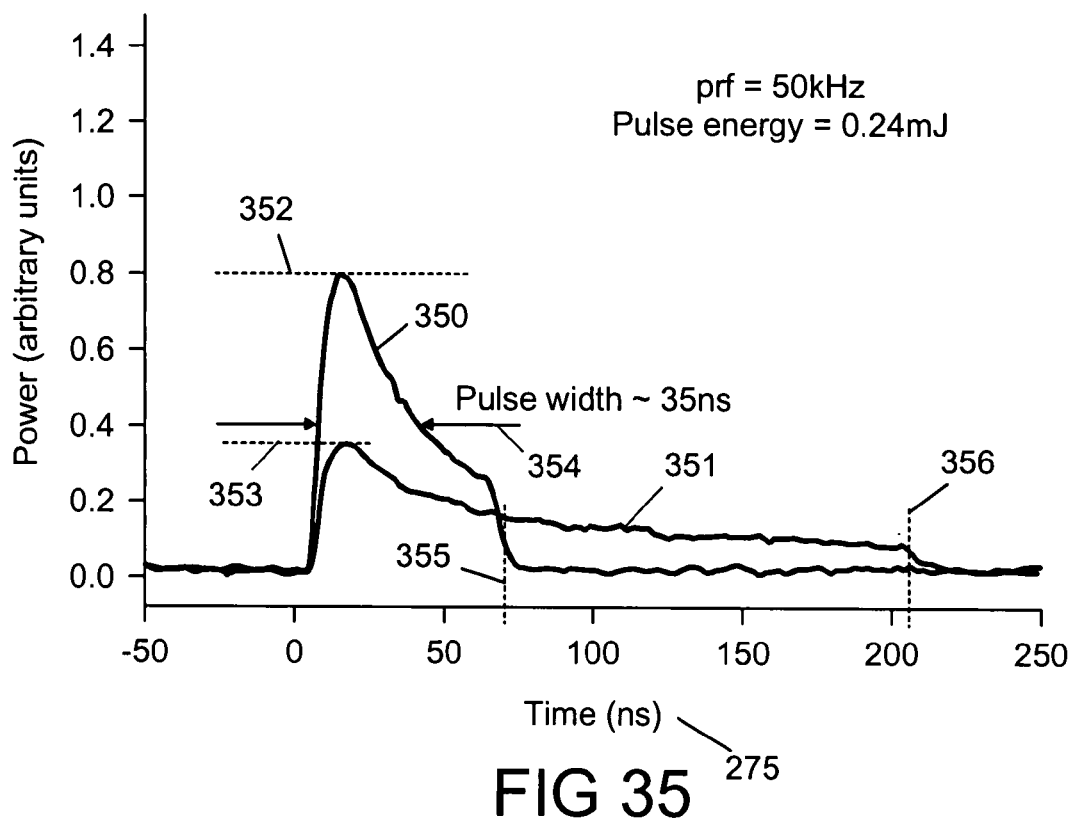

FIG. 35, shows the output power 350 and 351 versus time 275 measured for two different pulse widths 355 and 356 respectively. The pulse repetition frequency 176 was 50 kHz, the pulse energy 1710 was 0.24 mJ, and the average power 178 was 12 W. The full width half maxima pulse width 354 for the output power 350 was approximately 35 ns. The peak powers 352, 353 reduce with increasing pulse widths 355, 356.

Figure 36:
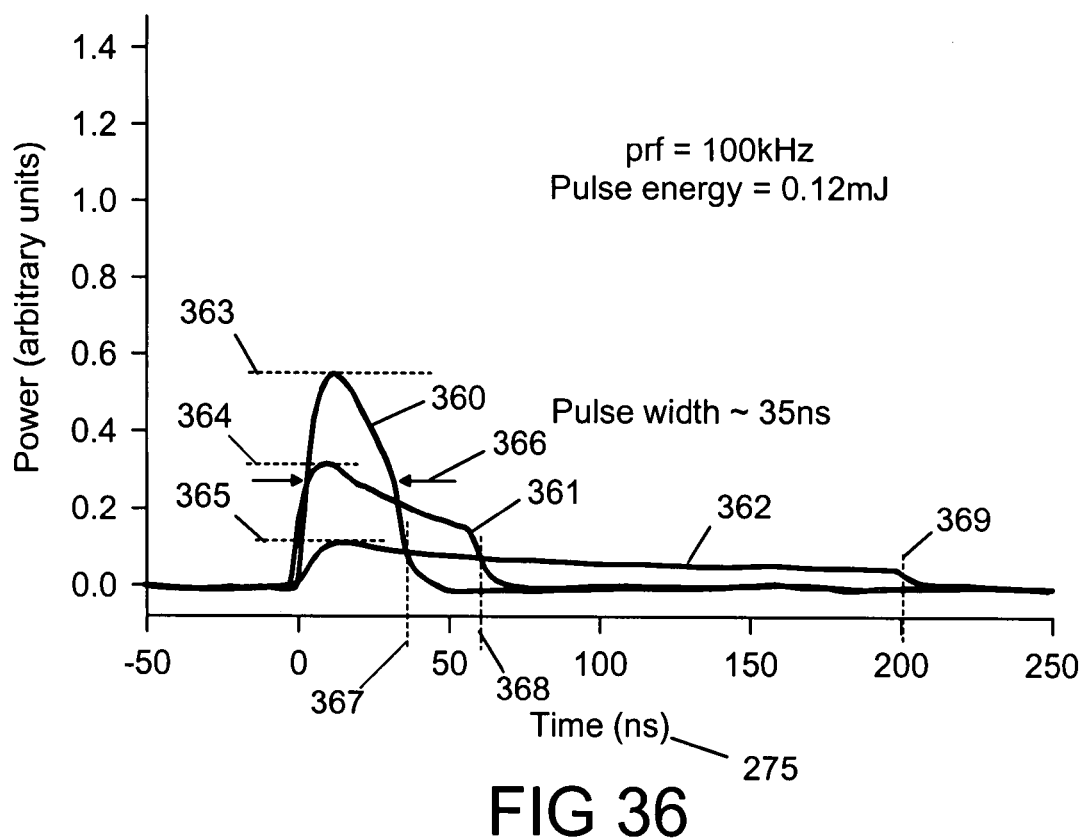

FIG. 36, shows the output power 360, 361 and 362 versus time 275 measured for three different pulse widths 367, 368 and 369 respectively. The pulse repetition frequency 176 was 100 kHz, the pulse energy 1710 was 0.12 mJ, and the average power 178 was 12 W. The full width half maxima pulse width 126 for the output power 360 was approximately 35 ns. The peak powers 363, 364, 365 reduce with increasing pulse widths 367, 368 and 369.

Figure 37:
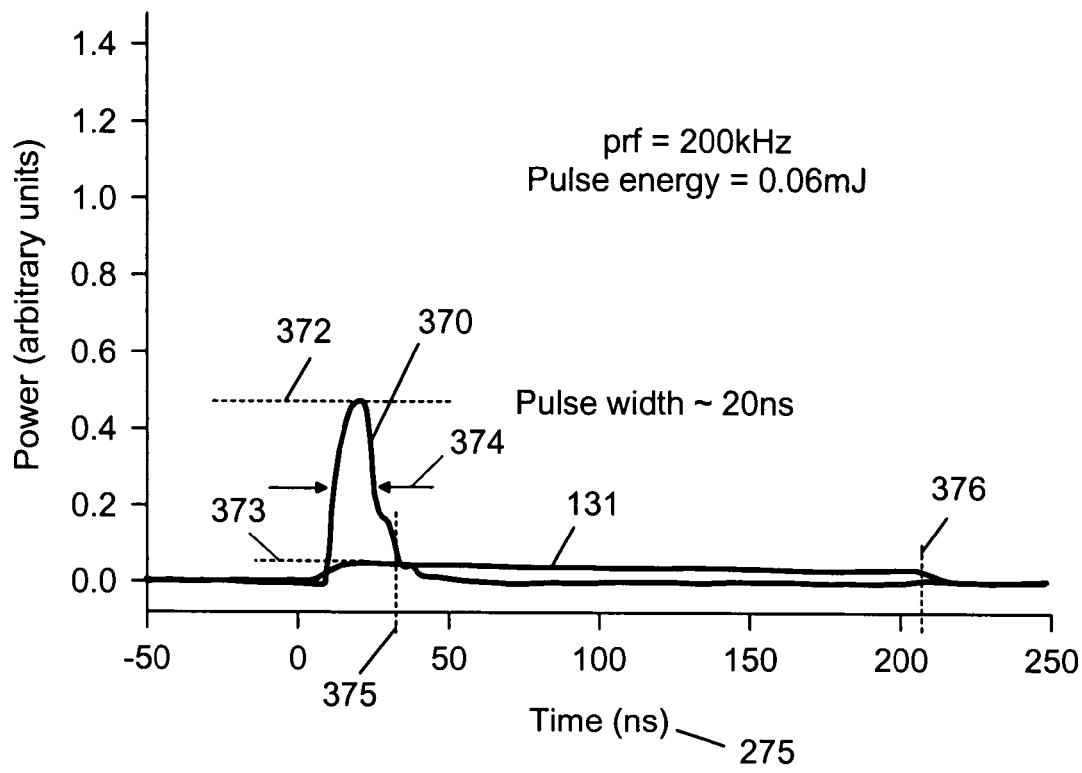

FIG. 37, shows the output power 370 and 371 versus time 275 measured for two different pulse widths 375 and 376 respectively. The pulse repetition frequency 176 was 200 kHz, the pulse energy 1710 was 0.06 mJ, and the average power 178 was 12 W. The full width half maxima pulse width 374 for the output power 370 was approximately 20 ns. The peak powers 372 and 373 reduce with increasing pulse widths 375 and 376.

By varying the shape of the seed laser pulse 175 in the apparatus of FIG. 19, the peak power 179 has been maintained above the 5 kW level over a range of pulse repetition frequencies 176 from 1 Hz to 200 kHz, while providing pulse energies 1710 in excess of 0.1 mJ. The peak power 179 has been maintained above the 3 kW level over a range of pulse repetition frequencies 176 from 1 Hz to 500 kHz, while providing pulse energies 1710 in excess of 0.04 mJ. Significantly, both these results were achieved without any evidence of SBS and with only two amplification stages.

By controlling the shape of the seed laser pulse 175 in the apparatus of FIG. 19, increasing the gain of the amplifiers 192, 193 and controlling their relative gain, we further demonstrated an average power 178 between 20 to 25 W, pulse energy 1710 in the range 0.8 to 1 mJ, full width half maxima pulse width 374 in the range 15-20 ns, peak power 179 in the range 18-26 kW, pulse repetition frequency 176 of 1 Hz to 25 kHz. Significantly, these results were also achieved without any evidence of SBS and with only two amplification stages.

In the system under study, the semiconductor diode 386 emitted 1 W peak power at 1090 nm. The power amplifier fibre was Yb3+ doped with Aeff=245 µm$^2$ and a pump absorption 1.8 dB/m @ 915 nm. The fibre 1 contained the pedestal 4, was arranged in a configuration similar to that shown in FIG. 4, and made according to U.S. Pat. No. 5,930,435, which is hereby incorporated by reference herein.

In this disclosure we have reported in detail our finding regarding the effects of pulse reshaping and the impact on the performance of pulsed fibre MOPAs. It is shown that properly designing the active fibre and appropriately defining its saturation energy can control the pulse reshaping. As a result, high peak powers and maximum possible energy can be achieved without the onset of SRS.

We have also discovered a pulsed fibre MOPA configuration, which maintains the peak power over a 5 kW level for repetition rates up to and exceeding 200 kHz. The MOPA configuration includes a directly modulated 1080 nm laser diode seed, followed by a two-stage all-fibre amplification unit and an additional delivery fibre. The average power is in excess of 12 W, the pulse energy lies in the 0.1-0.5 mJ range, the pulse duration varies between 10 ns and 200 ns, while the peak power remains constant at about the 5 kW or 10 kW level for rep rates in the range 10 kHz to >200 kHz.

Finally, we have demonstrated, using accelerated aging tests, that it is possible to develop Yb3+ doped optical fibres that do not photodarken under maximum inversion conditions.

Embodiments provided for herein are also in the form of a materials processing machine (e.g., one for cutting, welding, drilling, marking or processing materials) including one or more of the lasers and controllers described above.

Embodiments provided for herein also include a method of marking which method includes the step of providing a reflector within a marking laser.

Embodiments provided for herein also include a materials processing machine (e.g., one for cutting, welding, drilling, or processing materials) including one or more of the lasers and controllers described above.

It is to be appreciated that the embodiments described above with reference to the accompanying drawings have been given by way of example only and that modifications and additional components can be provided to enhance performance.

The embodiments described herein extend to the above mentioned features taken singly or in any combination.

We claim:

1. An apparatus for providing optical radiation having a first bandwidth, which apparatus comprises:
   a seed laser configured to provide seeding radiation;
   at least one amplifier configured to amplify the seeding radiation, wherein in use the amplifier emits a pulse having a peak power greater than 1 kW when seeded by the seed laser;
   a reflector; and wherein:
   the seed laser is a Fabry Perot semiconductor laser which is defined by an effective optical transit time, a spectrum, and a second bandwidth;
   the reflector is characterized by a third bandwidth;
   the seed laser is connected to the amplifier via the reflector;
   the reflector is arranged to reflect a proportion of the seeding radiation emitted by the seed laser back into the seed laser; and
   the amplifier comprises an optical fibre which comprises a core having a refractive index n1 and a pedestal having a refractive index n2, and wherein the optical fibre includes a first cladding made of glass having a refractive index n3 surrounding the pedestal, wherein:
   n1 is greater than n2;
   n2 is greater than n3; and
   the pedestal is adapted to guide optical radiation that escapes from the core;
   and wherein the amplifier is cladding pumped by coupling pump radiation into the first cladding, and the optical feedback from the reflector is such that the first bandwidth is less than the second bandwidth.

2. The apparatus of claim 1 wherein the reflector is a dispersive reflector.

3. The apparatus of claim 1 wherein the third bandwidth is greater than 1 nm.

4. The apparatus of claim 1 wherein the proportion is less than 20%.

5. The apparatus of claim 4 wherein the proportion is between 1% and 10%.

6. The apparatus of claim 1 wherein the reflector is located a distance less than 5 m from the seed laser.

7. The apparatus of claim 6 wherein the distance is less than 2 m.

8. The apparatus of claim 7 wherein the distance is between 0.5 m and 1.5 m.

9. The apparatus of claim 7 wherein the reflector is located a distance between 5 mm and 50 cm from the seed laser.

10. The apparatus of claim 1 wherein:
    the core comprises silica, a concentration of alumina in the range 0.1 to 4 mole percent, a concentration of phosphate in the range 2 to 20 mole percent; and
    the pedestal comprises silica, phosphate and germania.

11. The apparatus of claim 10 wherein the optical fibre is doped with at least one rare earth dopant disposed in at least one of the core and the pedestal.

12. The apparatus of claim 11 wherein the rare earth dopant is ytterbium having a concentration in the range 2000 to 60000 ppm.

13. The apparatus of claim 12 wherein the concentration of ytterbium is between approximately 15000 to 50000 ppm.

14. The apparatus of claim 13 wherein the concentration of ytterbium is between approximately 20000 to 45000 ppm.

15. The apparatus of claim 10 wherein the concentration of phosphate in the core is between approximately 12 to 17 mole percent.

16. The apparatus of claim 15 wherein the concentration of phosphate in the core is approximately 15 mole percent.

17. The apparatus of claim 10 wherein the concentration of alumina is between approximately 0.20 to 1 mole percent.

18. The apparatus of claim 17 wherein the concentration of alumina is between approximately 0.3 and 0.8 mole percent.

19. The apparatus of claim 1 wherein the optical fibre is a multimode waveguide at a signal wavelength.

20. The apparatus of claim 19 wherein the optical fibre is configured to propagate single mode light without significant distortion over a substantial length.

21. The apparatus of claim 1 wherein the optical fibre is a single mode waveguide.

22. The apparatus of claim 1 wherein the optical fibre comprises a waveguide having a numerical aperture less than 0.15.

23. The apparatus of claim 1 wherein:
   the optical fibre is a photo-darkening resistant optical fibre comprising a waveguide having a numerical aperture less than 0.15;
   the core comprises silica, a concentration of alumina of between approximately 0.3 and 0.8 mole percent, a concentration of phosphate of substantially 15 mole percent, a concentration of ytterbium substantially in the range 20000 to 45000 ppm; and
   the pedestal comprises silica, phosphate and germania.

24. The apparatus of claim 1 wherein the spectrum comprises individual laser lines separated by approximately 0.045 nm.

25. The apparatus of claim 1 wherein the third bandwidth is greater than 0.5 nm.

26. The apparatus of claim 25 wherein the third bandwidth is greater than approximately 2 nm.

27. The apparatus of claim 1 wherein the optical fibre comprises a waveguide having a numerical aperture less than 0.15, the core comprises silica, a concentration of alumina in the range 0.1 to 4 mole percent, a concentration of phosphate in the range 2 to 20 mole percent, a concentration of ytterbium in the range 2,000 to 60,000 ppm, and the pedestal comprises silica, phosphate and germania, and wherein the optical fibre is a photodarkening resistant optical fibre characterized by an increase in attenuation which is no greater than 5% in 2,000 hours at a wavelength between 1000 nm and 1100 nm when a 0.1 to 1 m length of the optical fibre is core pumped with approximately 400 mW of pump light at 976 nm.

28. The apparatus of claim 27 wherein the increase in attenuation is less than 1% in 2,000 hours.

29. A method comprising providing the apparatus of claim 1, generating a pulse having peak power of greater than 1 kW by seeding the amplifier with the seed laser, and using the pulse to mark a material.

30. The apparatus of claim 1 wherein the amplifier is side pumped.

31. The apparatus of claim 1 wherein the apparatus is configured to emit a peak power greater than 5 kW with a pulse energy greater than 0.04 mJ at pulse repetition frequencies from 1 Hz to 500 kHz, and the apparatus further comprises at least two optical fibre amplifiers which are connected to amplify the seeding radiation.

32. The apparatus of claim 1 wherein the apparatus is configured to emit a peak power greater than 18 kW with a pulse energy greater than 0.8 mJ at pulse repetition frequencies from 1 Hz to 25 kHz, and the apparatus further comprises at least two optical fibre amplifiers which are connected to amplify the seeding radiation.

* * * * *